(12) United States Patent
Khan et al.

(10) Patent No.: US 11,533,224 B2
(45) Date of Patent: *Dec. 20, 2022

(54) LOGIC REPOSITORY SERVICE SUPPORTING ADAPTABLE HOST LOGIC

(71) Applicant: Amazon Technologies, Inc., Seattle, WA (US)

(72) Inventors: Asif Khan, Cedar Park, TX (US); Islam Mohamed Hatem Abdulfattah Mohamed Atta, Vancouver (CA); Christopher Joseph Pettey, Cedar Park, TX (US); Kiran Kalkunte Seshadri, Cedar Park, TX (US); Nafea Bshara, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 309 days.

This patent is subject to a terminal disclaimer.

(21) Appl. No.: 16/990,765

(22) Filed: Aug. 11, 2020

(65) Prior Publication Data

US 2020/0374191 A1 Nov. 26, 2020

Related U.S. Application Data

(63) Continuation of application No. 15/634,940, filed on Jun. 27, 2017, now Pat. No. 10,764,129.
(Continued)

(51) Int. Cl.
*G06F 15/16* (2006.01)
*H04L 41/0813* (2022.01)
(Continued)

(52) U.S. Cl.
CPC .......... *H04L 41/0813* (2013.01); *G06F 13/28* (2013.01); *G06F 15/7867* (2013.01);
(Continued)

(58) Field of Classification Search
CPC ....................................................... G06F 16/10
(Continued)

(56) References Cited

U.S. PATENT DOCUMENTS 6,678,646 B1 * 1/2004 McConnell ............. G06F 30/39
703/22
6,785,816 B1 * 8/2004 Kivimaki ............... H04L 63/123
713/181
(Continued)

FOREIGN PATENT DOCUMENTS

WO WO/2001/045258 6/2001

OTHER PUBLICATIONS

International Search Report and Written Opinion issued in related International Application No. PCT/US2018/028098, dated Jul. 31, 2018, 11pps.

*Primary Examiner* — Mehran Kamran
(74) *Attorney, Agent, or Firm* — Klarquist Sparkman, LLP

(57) ABSTRACT

The following description is directed to a logic repository service supporting adaptable host logic. In one example, a method of a logic repository service can include receiving a first request to generate configuration data for configurable hardware using a specification for application logic. The method can include selecting a particular host logic shell from a group of host logic shells. The particular host logic shell can be used to encapsulate the application logic when the configurable hardware is configured. Configuration data for the configurable hardware can be generated. The configuration data can include data for implementing the application logic and at least a portion of the particular host logic shell. The method can include receiving a second request to download the configuration data to a host server computer comprising the configurable hardware. The configuration (Continued)

data can be transmitted to the host server computer in response to the second request.

13 Claims, 12 Drawing Sheets

Related U.S. Application Data

(60) Provisional application No. 62/486,906, filed on Apr. 18, 2017.

(51) Int. Cl.

| | | |
|---|---|---|
| *G06F 13/28* | (2006.01) | |
| *H04L 67/10* | (2022.01) | |
| *H04L 12/46* | (2006.01) | |
| *H04L 67/00* | (2022.01) | |
| *G06F 15/78* | (2006.01) | |
| *H04L 41/0806* | (2022.01) | |
| *H04L 41/0869* | (2022.01) | |
| *G06F 30/34* | (2020.01) | |
| *G06F 30/327* | (2020.01) | |
| *G06F 30/392* | (2020.01) | |
| *G06F 30/394* | (2020.01) | |
| *G06F 30/3323* | (2020.01) | |

(52) U.S. Cl.
CPC ........ *G06F 30/327* (2020.01); *G06F 30/3323* (2020.01); *G06F 30/34* (2020.01); *G06F 30/392* (2020.01); *G06F 30/394* (2020.01); *H04L 12/4633* (2013.01); *H04L 41/0806* (2013.01); *H04L 41/0869* (2013.01); *H04L 67/10* (2013.01); *H04L 67/34* (2013.01)

(58) Field of Classification Search
USPC ........................................................ 709/219
See application file for complete search history.

(56) References Cited

U.S. PATENT DOCUMENTS

| | | | | |
|---|---|---|---|---|
| 7,098,689 B1* | 8/2006 | Tuan | ................ | H03K 19/17784 327/544 |
| 7,716,497 B1* | 5/2010 | Trimberger | ............. | G06F 21/73 365/186 |
| 8,145,894 B1* | 3/2012 | Casselman | .......... | G06F 15/7871 713/1 |
| 9,548,740 B1* | 1/2017 | Chen | ....................... | G06F 30/34 |
| 10,764,129 B2* | 9/2020 | Khan | .................. | G06F 30/3323 |
| 2001/0021966 A1* | 9/2001 | Kawasaki | ............... | G06F 21/78 711/163 |
| 2005/0093571 A1* | 5/2005 | Suaris | ..................... | G06F 30/34 326/38 |
| 2005/0268092 A1* | 12/2005 | Shankar | ................ | G06F 21/575 713/164 |
| 2006/0015862 A1* | 1/2006 | Odom | ..................... | G06F 30/34 717/168 |
| 2006/0242686 A1* | 10/2006 | Toda | ................... | H04L 63/1416 726/3 |
| 2012/0005473 A1* | 1/2012 | Hofstee | ............... | G06F 15/7867 713/100 |
| 2012/0047371 A1* | 2/2012 | Woodall | .................. | G06F 21/76 713/189 |
| 2013/0035925 A1* | 2/2013 | Chang | ................... | G06F 30/331 703/28 |
| 2013/0145431 A1* | 6/2013 | Kruglick | ............... | G06F 21/629 726/4 |
| 2014/0380025 A1* | 12/2014 | Kruglick | ............. | G06F 15/7807 712/220 |
| 2015/0169376 A1* | 6/2015 | Chang | ................... | G06F 9/5022 718/104 |
| 2016/0094413 A1* | 3/2016 | Jain | ........................ | H04L 47/52 709/226 |
| 2016/0098505 A1* | 4/2016 | Larzul | .................. | G06F 30/331 703/15 |
| 2017/0123394 A1* | 5/2017 | Oliverio | ............. | G06F 15/7871 |
| 2017/0126487 A1* | 5/2017 | Xie | ...................... | G06F 9/45558 |
| 2017/0250802 A1* | 8/2017 | Shimizu | .................. | G09C 1/00 |
| 2018/0082083 A1* | 3/2018 | Smith | ................... | G06F 9/4416 |
| 2018/0196951 A1* | 7/2018 | Hoppert | ............. | G06F 9/45558 |
| 2018/0205553 A1* | 7/2018 | Hoppert | ................. | G06F 21/64 |
| 2018/0287869 A1* | 10/2018 | Munafo | ............. | H04W 12/069 |
| 2018/0357090 A1* | 12/2018 | Butcher | ............. | G06F 9/45558 |
| 2018/0357098 A1* | 12/2018 | Dube | ................... | G06F 9/4856 |

\* cited by examiner

LOGIC REPOSITORY SERVICE SUPPORTING ADAPTABLE HOST LOGIC

CROSS REFERENCE TO RELATED APPLICATIONS

This application is a continuation of U.S. application Ser. No. 15/634,940, filed on Jun. 27, 2017, which claims the benefit of U.S. Provisional Application Ser. No. 62/486,906, filed on Apr. 18, 2017, both applications entitled LOGIC REPOSITORY SERVICE SUPPORTING ADAPTABLE HOST LOGIC, which applications are incorporated by reference herein.

BACKGROUND

Cloud computing is the use of computing resources (hardware and software) which are available in a remote location and accessible over a network, such as the Internet. In some arrangements, users are able to buy these computing resources (including storage and computing power) as a utility on demand. Cloud computing entrusts remote services with a user's data, software and computation. Use of virtual computing resources can provide a number of advantages including cost advantages and/or the ability to adapt rapidly to changing computing resource needs.

The users of large computer systems may have diverse computing requirements resulting from different use cases. A compute service provider can include various different computer systems having different types of components with varying levels of performance and/or functionality. Thus, a user can select a computer system that can potentially be more efficient at executing a particular task. For example, the compute service provider can provide systems with varying combinations of processing performance, memory performance, storage capacity or performance, and networking capacity or performance. However, some users may desire to use hardware that is proprietary or highly specialized for executing their computing tasks. Thus, the compute service provider can be challenged to provide specialized computing hardware for these users while keeping a healthy mix of generalized resources so that the resources can be efficiently allocated among the different users.

DETAILED DESCRIPTION

Overview

Figure 1:
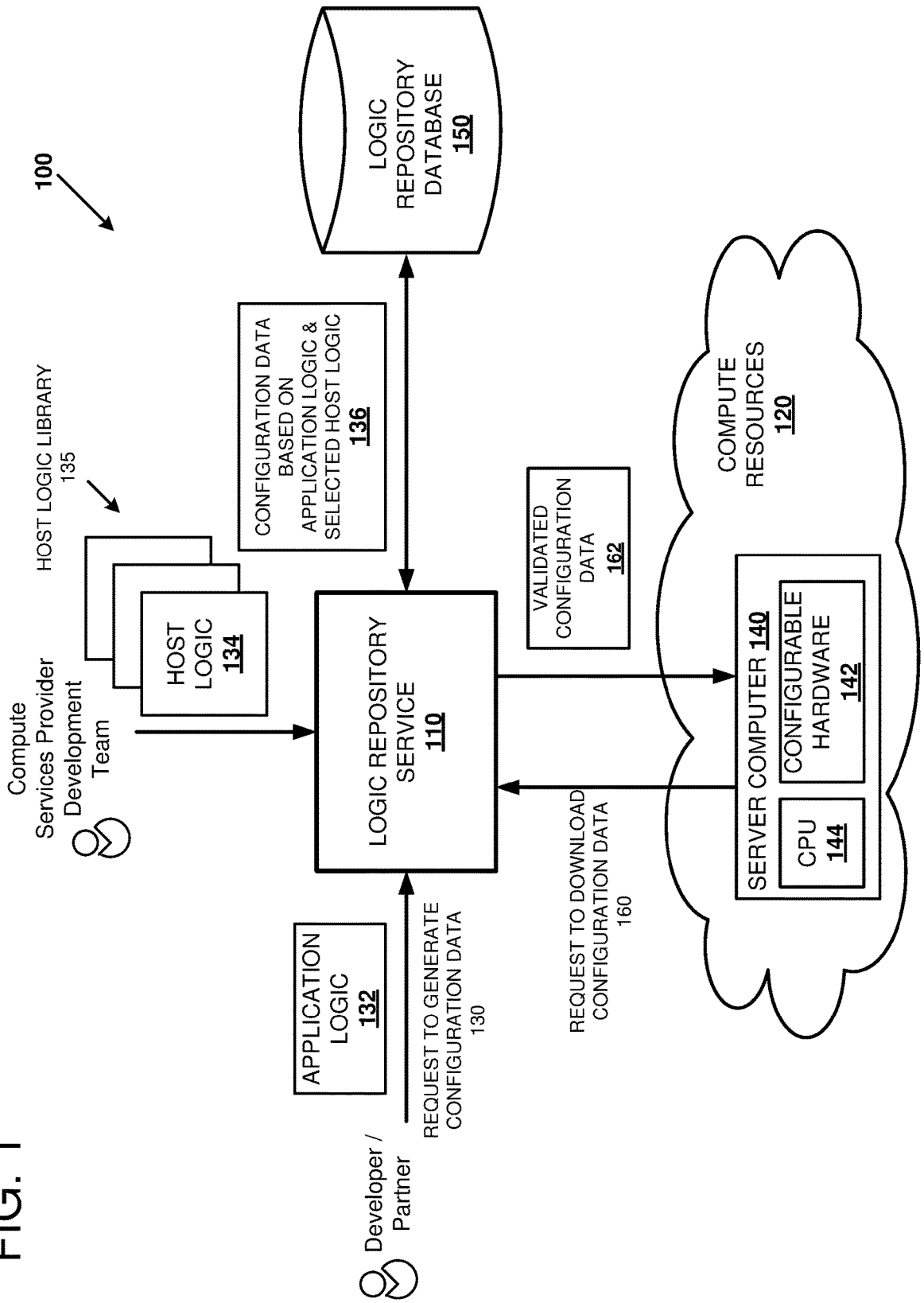
FIG. 1 is a system diagram showing an example of a system including a logic repository service for managing configuration data.

One solution for providing specialized computing resources within a set of reusable general computing resources is to provide a server computer comprising a configurable logic platform (also referred to as a configurable hardware platform and a programmable logic platform) as a choice among the general computing resources. As a specific example, the set of reusable general computing resources can include a server computer with an add-in card including a field-programmable gate array (FPGA). Configurable logic (also referred to as configurable hardware) is hardware that can be programmed or configured to perform a logic function that is specified by configuration data that is applied to the configurable logic. For example, a user of the computing resources can provide a specification (such as source code written in a hardware description language or other language) for configuring the configurable logic, the configurable logic can be configured according to the specification, and the configured logic can be used to perform a task for the user. However, allowing a user access to low-level hardware of the computing facility can potentially introduce security and privacy issues within the computing facility. As a specific example, a faulty or malicious design from one user could potentially cause a denial of service to other users if the configured logic caused one or more server computers within the computing facility to malfunction (e.g., crash, hang, or reboot) or be denied network services. As another specific example, a faulty or malicious design from one user could potentially corrupt or read data from another user if the configured logic is able to read and/or write memory of the other user's memory space. As another specific example, a faulty or malicious design from a user could potentially cause the configurable logic platform to malfunction if the configured logic includes a circuit (such as a ring oscillator) that causes the device to exceed a power consumption or temperature specification of the configurable logic platform.

As described herein, a compute services facility can include a variety of computing resources, where one type of the computing resources can include a server computer comprising a configurable logic platform. The configurable logic platform can be programmed or configured by a user of the computer system so that hardware (e.g., the configurable logic) of the computing resource is customized by the user. For example, the user can program the configurable logic so that it functions as a hardware accelerator that is tightly coupled to the server computer. For example, the hardware accelerator can be accessible via a local interconnect, such as Peripheral Component Interconnect Express (PCI-Express or PCIe), of the server computer. The user can execute an application on the server computer and tasks of the application can be performed by the hardware accelerator using PCIe transactions. By tightly coupling the hardware accelerator to the server computer, the latency between the accelerator and the server computer can be reduced which can potentially increase the processing speed of the application.

The compute services provider can manage the computing resources using software services to manage the configuration and operation of the configurable hardware. As one example, the compute services provider can execute a logic repository service for ingesting a hardware or logic design of a user, generating validated configuration data for configuring the configurable logic platform based on the logic design of the user, and downloading the validated configuration data to the configurable logic in response to a request to configure an instance of the configurable logic platform. The download request can be from the user that developed the logic design or from a user that has acquired a license to use the logic design. Thus, logic designs can be created by the compute services provider, a user, or a third-party separate from the user or the compute services provider. For example, a marketplace of accelerator intellectual property (IP) can be provided to the users of the compute services provider, and the users can potentially increase the speed of their applications by selecting an accelerator from the marketplace.

The compute services provider can potentially increase the security and/or availability of the computing resources by using the logic repository service to validate that logic designs conform to requirements of the compute services provider. For example, the logic repository service can check that a user-created logic design (also referred to as customer logic or application logic) is encapsulated by a particular host logic design (also referred to as a host logic shell) provided by the compute services provider. When the configurable logic platform is configured, both the host logic and the application logic can be loaded onto the configurable logic platform. The host logic can provide a framework or sandbox for the application logic to work within. In particular, the host logic can communicate with the application logic and constrain the functionality of the application logic to potentially increase the security and/or availability of the computing resources. For example, the host logic can perform bridging functions between the local interconnect (e.g., the PCIe interconnect) and the application logic so that the application logic cannot directly control the signaling on the local interconnect. The host logic can be responsible for forming packets or bus transactions on the local interconnect and ensuring that the protocol requirements are met. By controlling transactions on the local interconnect, the host logic can potentially prevent malformed transactions or transactions to out-of-bounds locations.

The configurable logic platform includes a fixed amount of resources that can be programmed. Thus, there can be a trade-off between using resources for the application logic or using resources for the host logic. The resources to perform the functions of the application logic are increased as the application logic becomes more complex. Similarly, the resources to perform the functions of the host logic are increased as the host logic becomes more complex. The compute services provider can provide a library or catalog of host logic designs having various features (and using different amounts of resources) that can interface with the application logic. Each host logic design can be a design that is trusted by the compute services provider to interoperate correctly with components within the configurable logic and/or components interfacing to the configurable logic. As one example, a user can select one of the host logic designs from the library of host logic designs, where the selected host logic design is adapted based on requirements of the application logic. Specifically, a user can select a more feature-laden host logic design (consuming more resources) when the application logic is less complex, and the user can select a less feature-laden host logic design (consuming less resources) when the application logic is more complex. As another example, a network-based service can select one of the host logic designs from the library of host logic designs by analyzing the application logic (such as by analyzing the amount of resources for implementing the application logic). For example, the different host logic designs can have different peripherals and/or accelerators and the selected host logic design can have a mix of peripherals and accelerators tuned for the application logic. By having a library of adaptable host logic designs, the configurable logic resources can be traded off within the application logic and the host logic.

FIG. 1 is a system diagram showing an example of a system 100 including a logic repository service 110 for managing configuration data that can be used to configure configurable resources within compute resources 120. In particular, the logic repository service 110 can be used for ingesting host and application logic into an infrastructure of a compute services provider, generating configuration data based on the ingested designs, maintaining a repository of the ingested designs and the generated configuration data, and providing configuration data for the configurable compute resources when the resources are deployed.

The logic repository service 110 can be a network-accessible service, such as a web service. Web services are commonly used in cloud computing. A web service is a software function provided at a network address over a network, such as the Internet (possibly, but not necessarily, using the World Wide Web). Clients initiate web service requests to servers and servers process the requests and return appropriate responses. The client web service requests are typically initiated using, for example, an API request. For purposes of simplicity, web service requests will be generally described below as API requests, but it is understood that other web service requests can be made. An API request is a programmatic interface to a defined request-response message system, typically expressed in JSON or XML, which is exposed via the web—most commonly by means of an HTTP-based web server. Thus, in certain implementations, an API can be defined as a set of Hypertext Transfer Protocol (HTTP) request interfaces, along with a definition of the structure of the messages used to invoke the API and the response messages, which can be in an Extensible Markup Language (XML) or JavaScript Object Notation (JSON) format. The API can specify a set of functions or routines that perform an action, which includes accomplishing a specific task or allowing interaction with a software component. When a web service receives the API request from a client device, the web service can generate a response to the request and send the response to the endpoint identified in the request. Additionally or alternatively, the web service can perform actions in response to the API request without generating a response to the endpoint identified in the request.

The logic repository service 110 can receive an API request 130 to generate configuration data for a configurable hardware platform, such as the configurable hardware 142 of the server computer 140. For example, the API request 130 can be originated by a developer or partner user of the compute services provider. The request 130 can include fields for specifying data and/or metadata about the logic design, the configurable hardware platform, user information, access privileges, production status, and various additional fields for describing information about the inputs, outputs, and users of the logic repository service 110. As specific examples, the request can include a description of the design, a production status (such as trial or production), an encrypted status of the input or output of the service, a reference to a location for storing an input file (such as the hardware design source code), a type of the input file, an instance type of the configurable hardware, and a reference to a location for storing an output file or report. In particular, the request can include a reference to a hardware design specifying application logic 132 for implementation on the configurable hardware platform. Specifically, a specification of the application logic 132 and/or of the host logic 134 can be a collection of files, such as source code, a netlist generated by a logic synthesis tool, and/or placed and routed logic gates generated by a place and route tool. The source code can include code written in a hardware description language (HDL), a register transfer logic (RTL) language, or a high-level language such as Open Computing Language (OpenCL) or C.

The compute resources 120 can include many different types of hardware and software categorized by instance type. In particular, an instance type specifies at least a portion of the hardware and software of a resource. For example, hardware resources can include servers with central processing units (CPUs) of varying performance levels (e.g., different clock speeds, architectures, cache sizes, and so forth), servers with and without co-processors (such as graphics processing units (GPUs) and configurable logic), servers with varying capacity and performance of memory and/or local storage, and servers with different networking performance levels. Example software resources can include different operating systems, application programs, and drivers. One example instance type can comprise the server computer 140 including a central processing unit (CPU) 144 in communication with the configurable hardware 142. The configurable hardware 142 can include programmable logic such as an FPGA, a programmable logic array (PLA), a programmable array logic (PAL), a generic array logic (GAL), or a complex programmable logic device (CPLD), for example. As specific examples, an "F1.small" instance type can include a first type of server computer with one capacity unit of FPGA resources, an "F1.medium" instance type can include the first type of server computer with two capacity units of FPGA resources, an "F1.large" instance type can include the first type of server computer with eight capacity units of FPGA resources, and an "F2.large" instance type can include a second type of server computer with eight capacity units of FPGA resources.

The logic repository service 110 can generate configuration data 136 in response to receiving the API request 130. The generated configuration data 136 can be based on the application logic 132 and a particular host logic design 134 selected from the host logic library 135. The host logic library 135 can include multiple host logic designs. For example, different host logic designs can include different numbers of on-chip peripherals, off-chip peripherals, and/or accelerators. A user can select the particular host logic design 134 based on features of the application logic 132. For example, a large and complex application logic design 132 can use a relatively large amount of the resources of the configurable logic and so a smaller, reduced feature host logic design can be used so that both the application logic design 132 and the host logic design 134 can fit within the capacity of the configurable hardware 142. As another example, a smaller application logic design 132 can offload some functions onto accelerators of a host logic design 134. Thus, the particular host logic design 134 can be adapted based on the application logic design 132 providing more flexibility for user while still providing security and availability for the compute services provider.

The generated configuration data 136 can include information that can be used to program or configure the configurable hardware 142 so that it performs the functions specified by the application logic 132 and the host logic 134. As one example, the compute services provider can generate the host logic 134 including logic for interfacing between the CPU 144 and the configurable hardware 142. Specifically, the host logic 134 can include logic for masking or shielding the application logic 132 from communicating directly with the CPU 144 so that all CPU-application logic transactions pass through the host logic 134. In this manner, the host logic 134 can potentially reduce security and availability risks that could be introduced by the application logic 132.

Generating the configuration data 136 can include performing checks and/or tests on the application logic 132, integrating the application logic 132 into a host logic 134 wrapper, synthesizing the application logic 132, and/or placing and routing the application logic 132. Checking the application logic 132 can include verifying the application logic 132 complies with one or more criteria of the compute services provider. For example, the application logic 132 can be analyzed to determine whether interface signals and/or logic functions are present for interfacing to the host logic 134. In particular, the analysis can include analyzing source code and/or running the application logic 132 against a suite of verification tests. The verification tests can be used to confirm that the application logic is compatible with the host logic. As another example, the application logic 132 can be analyzed to determine whether the application logic 132 fits within a designated region of the specified instance type. As another example, the application logic 132 can be analyzed to determine whether the application logic 132 includes any prohibited logic functions, such as ring oscillators or other potentially harmful circuits. As another example, the application logic 132 can be analyzed to determine whether the application logic 132 has any naming conflicts with the host logic 134 or any extraneous outputs that do not interface with the host logic 134. As another example, the application logic 132 can be analyzed to determine whether the application logic 132 attempts to interface to restricted inputs, outputs, or hard macros of the configurable hardware 142. If the application logic 132 passes the checks of the logic repository service 110, then the configuration data 136 can be generated. If any of the checks or tests fail, the generation of the configuration data 136 can be aborted.

Generating the configuration data 136 can include compiling and/or translating source code of the application logic 132 and the host logic 134 into data that can be used to program or configure the configurable hardware 142. For example, the logic repository service 110 can integrate the application logic 132 into a host logic 134 wrapper. Specifically, the application logic 132 can be instantiated in a system design that includes the application logic 132 and the host logic 134. The integrated system design can synthesized, using a logic synthesis program, to create a netlist for the system design. The netlist can be placed and routed, using a place and route program, for the instance type specified for the system design. The placed and routed design can be converted to configuration data 136 which can be used to program the configurable hardware 142. For example, the configuration data 136 can be directly output from the place and route program.

As one example, the generated configuration data 136 can include a complete or partial bitstream for configuring all or a portion of the configurable logic of an FPGA. An FPGA can include configurable logic and non-configurable logic. The configurable logic can include programmable logic blocks comprising combinational logic and/or look-up tables (LUTs) and sequential logic elements (such as flip-flops and/or latches), programmable routing and clocking resources, programmable distributed and block random access memories (RAMs), digital signal processing (DSP) bitslices, and programmable input/output pins. The bitstream can be loaded into on-chip memories of the configurable logic using configuration logic (e.g., a configuration access port). The values loaded within the on-chip memories can be used to control the configurable logic so that the configurable logic performs the logic functions that are specified by the bitstream. Additionally, the configurable logic can be divided into different regions which can be configured independently of one another. As one example, a full bitstream can be used to configure the configurable logic across all of the regions and a partial bitstream can be used to configure only a portion of the configurable logic regions. The non-configurable logic can include hard macros that perform a specific function within the FPGA, such as input/output blocks (e.g., serializer and deserializer (SERDES) blocks and gigabit transceivers), analog-to-digital converters, memory control blocks, test access ports, and configuration logic for loading the configuration data onto the configurable logic.

The logic repository service 110 can store the generated configuration data 136 in a logic repository database 150. The logic repository database 150 can be stored on removable or non-removable media, including magnetic disks, direct-attached storage, network-attached storage (NAS), storage area networks (SAN), redundant arrays of independent disks (RAID), magnetic tapes or cassettes, CD-ROMs, DVDs, or any other medium which can be used to store information in a non-transitory way and which can be accessed by the logic repository service 110. Additionally, the logic repository service 110 can be used to store input files (such as the specifications for the application logic 132 and the host logic 134) and metadata about the logic designs and/or the users of the logic repository service 110. The generated configuration data 136 can be indexed by one or more properties such as a user identifier, an instance type or types, a marketplace identifier, a machine image identifier, and a configurable hardware identifier, for example.

The logic repository service 110 can receive an API request 160 to download configuration data. For example, the request 160 can be generated when a user of the compute resources 120 launches or deploys a new instance (e.g., an "F1.small" instance) within the compute resources 120. As another example, the request 160 can be generated in response to a request from an application executing on an operating instance. The request 160 can include a reference to the source and/or destination instance, a reference to the configuration data to download (e.g., an instance type, a marketplace identifier, a machine image identifier, or a configurable hardware identifier), a user identifier, an authorization token, and/or other information for identifying the configuration data to download and/or authorizing access to the configuration data. If the user requesting the configuration data is authorized to access the configuration data, the configuration data can be retrieved from the logic repository database 150, and validated configuration data 162 (e.g. a full or partial bitstream) can be downloaded to the requesting instance (e.g., server computer 140). The validated configuration data 162 can be used to configure the configurable logic of the destination instance.

The logic repository service 110 can verify that the validated configuration data 162 can be downloaded to the requesting instance. Validation can occur at multiple different points by the logic repository service 110. For example, validation can include verifying that the application logic 132 is compatible with the host logic 134. In particular, a regression suite of tests can be executed on a simulator to verify that the host logic 134 performs as expected after the application logic 132 is added to the design. Additionally or alternatively, it can be verified that the application logic 132 is specified to reside only in reconfigurable regions that are separate from reconfigurable regions of the host logic 134. As another example, validation can include verifying that the validated configuration data 162 is compatible with the instance type to download to. As another example, validation can include verifying that the requestor is authorized to access the validated configuration data 162. If any of the validation checks fail, the logic repository service 110 can deny the request to download the validated configuration data 162. Thus, the logic repository service 110 can potentially safeguard the security and the availability of the computing resources 120 while enabling a user to customize hardware of the computing resources 120.

Example Configurable Platforms Including Host Logic Shells

Figure 2:
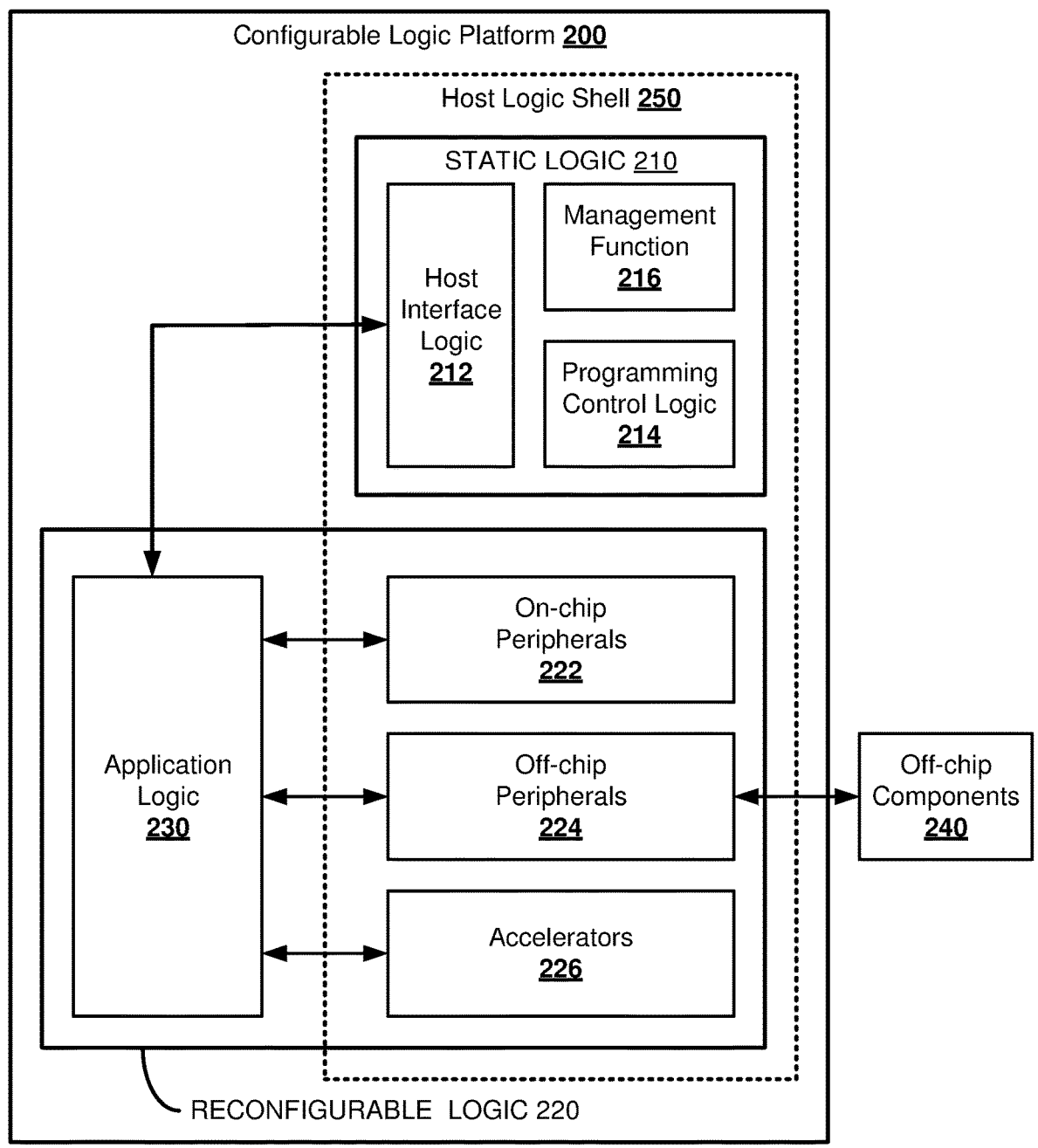
FIG. 2 is a system diagram showing an example of a configurable logic platform including a host logic shell and application logic.
Figure 3:
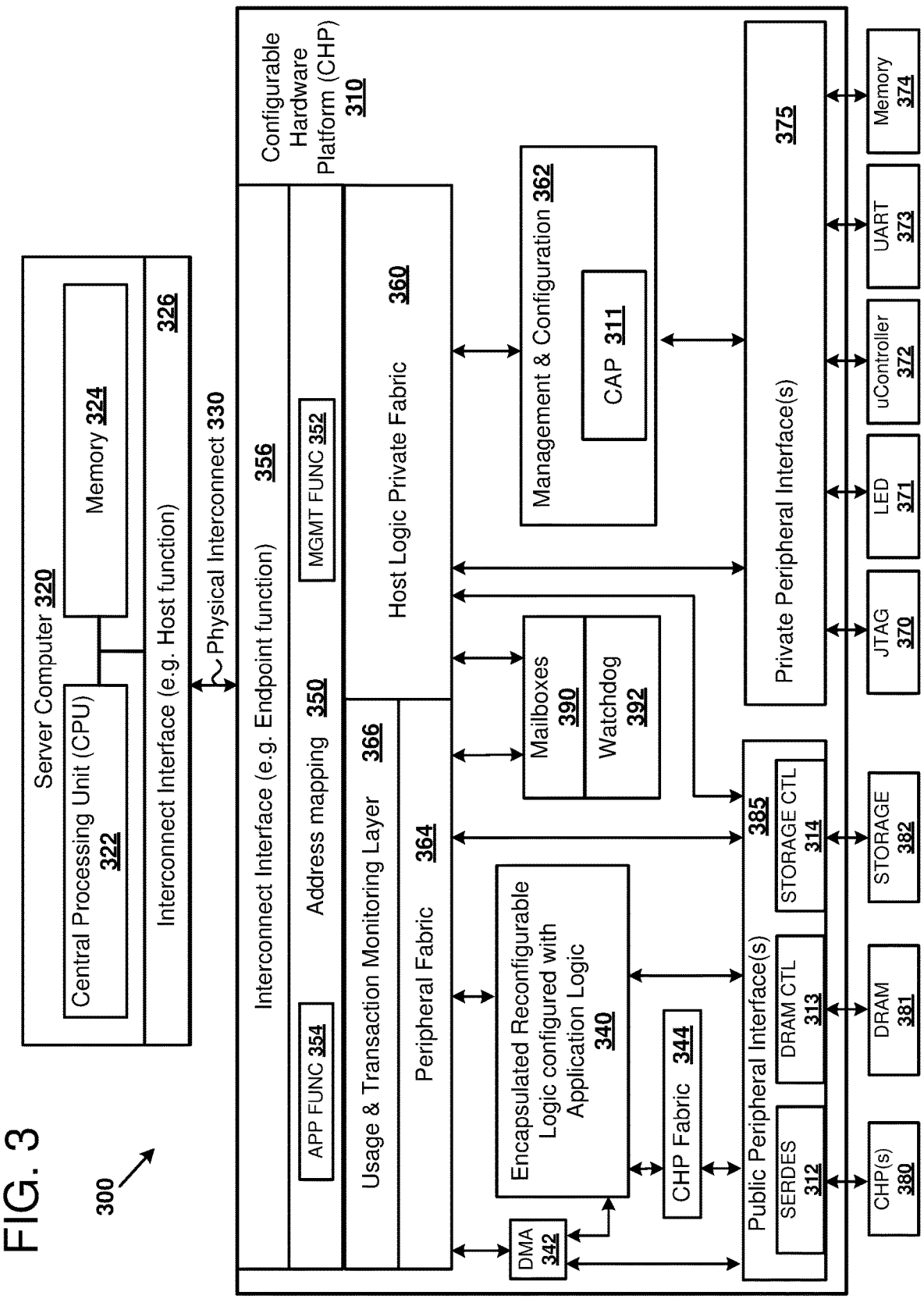
FIG. 3 is a system diagram showing an example of a particular implementation of a configurable logic platform including a host logic shell and application logic.

FIGS. 2 and 3 are system diagrams showing examples of configurable logic platforms including a host logic shell and application logic. FIG. 2 illustrates aspects of how the host logic shell and the application logic can be apportioned among the resources of the configurable logic platform. Specifically, the configurable logic platform can be logically organized into static and reconfigurable logic areas, and the host logic shell and application logic can be apportioned between these areas. FIG. 3 illustrates a particular implementation of a configurable logic platform and shows example functions that are included in the host logic shell. Additionally, FIG. 3 illustrates how the host logic shell can be used to encapsulate the application logic.

FIG. 2 is a system diagram showing an example of a configurable logic platform 200 including a host logic shell 250 and application logic 230. As one example, the configurable logic platform 200 can include one or more FPGA integrated circuits. The host logic shell 250 encapsulates the application logic 230 so that the application logic 230 can potentially be blocked from formatting transactions and directly controlling the signals used to drive the physical interconnect to a host server computer connected to the configurable logic platform 200. In other words, the host logic shell 250 can be interposed between the application logic 230 and physical interfaces (not shown) of the configurable logic platform 200. Thus, the application logic 230 cannot be used to inadvertently or maliciously violate protocols of the physical interconnect which could potentially damage or cause a malfunction of an external component.

In addition to categorizing the resources of the configurable logic platform 200 as the host logic shell 250 or the application logic 230, the resources can be categorized as static logic 210 and reconfigurable logic 220. The resources of the static logic 210 and the reconfigurable logic 220 can have at least some identical types of components (e.g., LUTs, flip-flops, latches, or RAMs), but the static logic 210 is, in at least some cases, programmed at a different time than the reconfigurable logic 220. For example, the static logic 210 can be programmed during an initialization sequence of the configurable logic platform 200. The initialization sequence can occur in response to detecting a power-on condition or detecting a reset condition, for example. As one example, configuration data for programming the static logic 210 can be stored on an embedded flash memory (not shown), or on a flash memory (not shown) connected to the configurable logic platform 200. The reconfigurable logic 220 can be programmed after the static logic 210 has been programmed and is in operation. The resources of the configurable logic platform 200 can be divided into different physical regions, where some of the regions can be programmed with the static logic 210 and other regions can be programmed with the reconfigurable logic 220. As one example, the static and reconfigurable regions can be defined (e.g., partitioned) using a floor-planner tool. The application logic 230 can be programmed in a region of the reconfigurable logic 220 and the host logic shell 250 can be programmed in regions of both the reconfigurable logic 220 and the static logic 210.

The host logic shell 250 can include components that are not likely to change for different customers using the configurable logic platform 200. These components can be programmed in the static logic 210. For example, the components of the host logic shell 250 that may be common for multiple customers can include host interface logic 212, programming control logic 214, and a management function 216.

The host interface logic 212 can include the logic circuitry used for communicating with a host server computer that is allocated for the customer's use. Specifically, the host interface logic 212 can be used to connect to the physical interconnect and to communicate with the server computer 120 using a communication protocol of the physical interconnect. As one example, the server computer can communicate with the configurable logic platform 200 using a transaction including an address associated with the configurable logic platform 200. Similarly, the configurable logic platform 200 can communicate with the server computer using a transaction including an address associated with the server computer. The addresses associated with the various devices connected to the physical interconnect can be predefined by a system architect and programmed into software residing on the devices. Additionally or alternatively, the communication protocol can include an enumeration sequence where the devices connected to the physical interconnect are queried and where addresses are assigned to each of the devices as part of the enumeration sequence. As one example, the host server computer can issue queries to each of the devices connected to the physical interconnect. The host interface logic 212 can respond to the queries by providing information about the configurable logic platform 200, such as how many functions are present on the configurable logic platform 200, and a size of an address range associated with each of the functions of the configurable logic platform 200. Based on this information, addresses can be allocated such that each function of each device connected to the physical interconnect is assigned a non-overlapping range of addresses. After enumeration, the host server computer can route transactions to functions of the configurable logic platform 200 based on an address of the transaction. Having the host interface logic 212 as part of the host logic shell 250 can potentially prevent the application logic 230 from creating malformed or unauthorized requests over the host interface.

The programming control logic 214 can include circuitry for configuring and reconfiguring the configurable logic platform 200. Having the programming control logic 214 as part of the host logic shell 250 can potentially prevent the application logic 230 from reprogramming the resources of the configurable logic platform 200. Specifically, having the programming control logic 214 as part of the host logic shell 250 can potentially prevent components of the host logic shell 250 from being reprogrammed by the application logic 230.

The management function 216 can be used for managing and configuring the configurable logic platform 200. Commands and data can be sent from the server computer to the management function 216 using transactions that target the address range of the management function 216. For example, the server computer can generate transactions to transfer data (e.g., configuration data) and/or write control registers of the configurable logic platform 200 that are mapped to one or more addresses within the address range of the management function 216. Writing the control registers can cause the configurable logic platform 200 to perform operations, such as configuring and managing the configurable logic platform 200.

The host logic shell 250 can include components that can be adapted for different customers using the configurable logic platform 200. As one example, the customers can be presented with a catalog or list of host logic shells and each customer can select the host logic shell that is likely to best meet requirements of the application logic. As another example, the customers can be presented with the basic host logic shell and can select particular features of the host logic shell to implement. The selectable features can be programmed in the reconfigurable logic 220. The selectable features can be accessed by the application logic 230 using a predefined interface to the host logic shell 250.

As one example, the components of the host logic shell 250 that may be adapted for specific customers can include internal (e.g., on-chip) peripheral logic 222, external (e.g., off-chip) peripheral logic 224, and/or accelerators 226. The internal peripheral logic 222 can include one or more of a processor, a memory (such as a RAM, a ROM, a flash memory, and so forth), mailboxes, timers, and so forth. The external peripheral logic 224 can include logic functions and interfaces for accessing off-chip components 240. For example, the external peripheral logic 224 can include: a storage controller for communicating with an off-chip storage device, such as a hard disk drive or a solid-state drive; a memory controller for communicating with an off chip memory, such as a DRAM; an interface for communicating with other configurable logic platforms, such as a serial interface or parallel interface; and interfaces for communicating with light emitting diodes, microcontrollers, JTAG (e.g., IEEE 1149.1) devices, universal asynchronous receiver/transmitters (UART); and so forth. The accelerators 226 can include a general-purpose or application-specific processor, a direct memory access (DMA) engine, an encryption engine, a decryption engine, a compression engine, a decompression engine, and so forth.

FIG. 3 is a system diagram showing an example of a system 300 including a configurable hardware platform 310 and a server computer 320. The configurable hardware platform 310 is programmed with application logic and a host logic shell adapted based on the application logic. As illustrated in FIG. 3, the components of configurable hardware platform 310, other than the application logic 340, are part of the host logic shell. The server computer 320 and the configurable hardware platform 310 can be connected via a physical interconnect 330. For example, the physical interconnect 330 can be PCI express, PCI, or any other interconnect that tightly couples the server computer 320 to the configurable hardware platform 310. The server computer 320 can include a CPU 322, memory 324, and an interconnect interface 326. For example, the interconnect interface 326 can provide bridging capability so that the server computer 320 can access devices that are external to the server computer 320. For example, the interconnect interface 326 can include a host function, such as root complex functionality as used in PCI express.

The configurable hardware platform 310 can include reconfigurable logic blocks and other hardware. The reconfigurable logic blocks can be configured or programmed to perform various functions of the configurable hardware platform 310. The reconfigurable logic blocks can be programmed multiple times with different configurations so that the blocks can perform different functions over the lifetime of the device. For example, the reconfigurable logic blocks can be programmed with one configuration for one customer and can be programmed with a different configuration for a different customer. The functions of the configurable hardware platform 310 can be categorized based upon the purpose or capabilities of each function, or based upon when the function is loaded into the configurable hardware platform 310. For example, the configurable hardware platform 310 can include static logic, reconfigurable logic, and hard macros. The functionality for the static logic, reconfigurable logic, and hard macros can be configured at different times and by different methods. For example, functionality of the hard macros can be hard-wired when the configurable hardware platform 310 is fabricated. As another example, the static logic can be loaded from an internal or external Flash memory, via a JTAG controller or a baseboard management controller (BMC), and so forth. As another example, the reconfigurable logic can be loaded using a host interface that is implemented within the static logic. Thus, the functionality of the configurable hardware platform 310 can be loaded incrementally.

A hard macro can perform a predefined function and can be available when the configurable hardware platform 310 is powered on. For example, a hard macro can include hard-wired circuits that perform a specific function. As specific examples, the hard macros can include a configuration access port (CAP) 311 for configuring the configurable hardware platform 310, a serializer-deserializer transceiver (SERDES) 312 for communicating serial data, a memory or dynamic random access memory (DRAM) controller 313 for signaling and controlling off-chip memory (such as a double data rate (DDR) DRAM 381), and a storage controller 314 for signaling and controlling a storage device 382.

The static logic can be loaded at boot time onto reconfigurable logic blocks. For example, configuration data specifying the functionality of the static logic can be loaded from an on-chip or off-chip flash memory device during a boot-up sequence. The boot-up sequence can include detecting a power event (such as by detecting that a supply voltage has transitioned from below a threshold value to above the threshold value) and deasserting a reset signal in response to the power event. An initialization sequence can be triggered in response to the power event or the reset being deasserted. The initialization sequence can include reading configuration data stored on the flash device and loading the configuration data onto the configurable hardware platform 310 using the configuration access port 311 so that at least a portion of the reconfigurable logic blocks are programmed with the functionality of the static logic. After the static logic is loaded, the configurable hardware platform 310 can transition from a loading state to an operational state that includes the functionality of the static logic. Basic communication and protection logic of the host logic shell can be implemented in static logic, for example.

The reconfigurable logic can be loaded onto reconfigurable logic blocks while the configurable hardware platform 310 is operational (e.g., after the static logic has been loaded). The configuration data corresponding to the reconfigurable logic can be stored in an on-chip or off-chip memory and/or the configuration data can be received or streamed from an interface (e.g., the interconnect interface 356) of the configurable hardware platform 310. The reconfigurable logic can be divided into non-overlapping regions, which can interface with static logic. For example, the reconfigurable regions can be arranged in an array or other regular or semi-regular structure. For example, the array structure may include holes or blockages where hard macros are placed within the array structure. The different reconfigurable regions can communicate with each other, the static logic, and the hard macros by using signal lines that can be specified as static logic. The different reconfigurable regions can be configured at different points in time so that a first reconfigurable region can be configured at a first point in time and a second reconfigurable region can be configured at a second point in time.

The functions of the configurable hardware platform 310 can be divided or categorized based upon the purpose or capabilities of the functions. For example, the functions can be categorized as control plane functions, data plane functions, and shared functions. A control plane can be used for management and configuration of the configurable hardware platform 310. The data plane can be used to manage data transfer between accelerator logic loaded onto the configurable hardware platform 310 and the server computer 320. Shared functions can be used by both the control plane and the data plane. The control plane functionality can be loaded onto the configurable hardware platform 310 prior to loading the data plane functionality. The data plane can include encapsulated reconfigurable logic configured with application logic 340. The control plane can include host logic of the configurable hardware platform 310.

Generally, the data plane and the control plane can be accessed using different functions of the configurable hardware platform 310, where the different functions are assigned to different address ranges. Specifically, the control plane functions can be accessed using a management function 352 and the data plane functions can be accessed using a data path function or an application function 354. An address mapping layer 350 can differentiate transactions bound for the control plane or the data plane. In particular, transactions from the server computer 320 bound for the configurable hardware platform 310 can be identified using an address within the transaction. Specifically, if the address of the transaction falls within the range of addresses assigned to the configurable hardware platform 310, the transaction is destined for the configurable hardware platform 310. The transaction can be sent over the physical interconnect 330 and received at the interconnect interface 356. The interconnect interface 356 can be an endpoint of the physical interconnect 330. It should be understood that the physical interconnect 330 can include additional devices (e.g., switches and bridges) arranged in a fabric for connecting devices or components to the server computer 320.

The address mapping layer 350 can analyze the address of the transaction and determine where to route the transaction within the configurable hardware platform 310 based on the address. For example, the management function 352 can be assigned a first range of addresses and different functions of the management plane can be accessed by using different addresses within that range. Transactions with addresses falling within the range assigned to the management function 352 can be routed through the host logic private fabric 360 to the different blocks of the control plane. For example, transactions can be addressed to a management and configuration block 362. Similarly, the application function 354 can be assigned a second range of addresses and different functions of the data plane can be accessed by using different addresses within that range.

The management and configuration block 362 can include functions related to managing and configuring the configurable hardware platform 310. For example, the management and configuration block 362 can provide access to the configuration access port 311 so that the reconfigurable logic blocks can be configured. For example, the server computer 320 can send a transaction to the management and configuration block 362 to initiate loading of the application logic within the encapsulated reconfigurable logic 340. The configuration data corresponding to the application logic can be sent from the server computer 320 to the management function 352. The management function 352 can route the configuration data corresponding to the application logic through the host logic fabric 360 to the configuration access port 311 so that the application logic can be loaded.

As another example, the management and configuration block 362 can store metadata about the configurable hardware platform 310. For example, versions of the different logic blocks, update histories, and other information can be stored in memory of the management and configuration block 362. The server computer 320 can read the memory to retrieve some or all of the metadata. Specifically, the server computer 320 can send a read request targeting the memory of the management and configuration block 362 and the management and configuration block 362 can generate read response data to return to the server computer 320.

The management function 352 can also be used to access private peripherals of the configurable hardware platform 310. The private peripherals are components that are only accessible from the control plane. For example, the private peripherals can include a JTAG (e.g., IEEE 1149.1) controller 370, light emitting displays (LEDs) 371, a microcontroller 372, a universal asynchronous receiver/transmitter (UART) 373, a memory 374 (e.g., a serial peripheral interface (SPI) flash memory), and any other components that are accessible from the control plane and not the data plane. The management function 352 can access the private peripherals by routing commands through the host logic private fabric 360 and the private peripheral interface(s) 375. The private peripheral interface(s) 375 can directly communicate with the private peripherals.

Public peripherals are shared functions that are accessible from either the control plane or the data plane. For example, the public peripherals can be accessed from the control plane by addressing transactions within the address range assigned to the management function 352. The public peripherals can be accessed from the data plane by addressing transactions within the address range assigned to the application function 354. Thus, the public peripherals are components that can have multiple address mappings and can be used by both the control plane and the data plane. Examples of the public peripherals are other configurable hardware platform(s) (CHP(s)) 380, DRAM 381 (e.g., DDR DRAM), storage devices 382 (e.g., hard disk drives and solid-state drives), and other various components that can be used to generate, store, or process information. The public peripherals can be accessed via the public peripheral interfaces 385. Thus, the public peripheral interfaces 385 can be an intermediary layer transposed between the public peripherals and the other functions of the configurable hardware platform 310. Specifically, the public peripheral interfaces 385 can translate requests from the control plane or the data plane and format communications to the public peripherals into a native protocol of the public peripherals.

Mailboxes 390 and watchdog timers 392 are shared functions that are accessible from either the control plane or the data plane. Specifically, the mailboxes 390 can be used to pass messages and other information between the control plane and the data plane. For example, the mailboxes 390 can include buffers, control registers (such as semaphores), and status registers. By using the mailboxes 390 as an intermediary between the control plane and the data plane, isolation between the data plane and the control plane can potentially be increased which can increase the security of the configurable hardware platform 310.

The watchdog timers 392 can be used to detect and recover from hardware and/or software malfunctions. For example, a watchdog timer 392 can monitor an amount of time taken to perform a particular task, and if the amount of time exceeds a threshold, the watchdog timer 392 can initiate an event, such as writing a value to a control register or causing an interrupt or reset to be asserted. As one example, the watchdog timer 392 can be initialized with a first value when beginning a first task. The watchdog timer 392 can automatically count down after it is initialized and if the watchdog timer 392 reaches a zero value, an event can be generated. Alternatively, if the first task finishes before the watchdog timer 392 reaches a zero value, the watchdog timer 392 can be reinitialized with a second value when beginning a second task. The first and second values can be selected based on a complexity or an amount of work to complete in the first and second tasks, respectively.

The application function 354 can be used to access the data plane functions, such as the application logic 340. For example, a transaction directed to the application logic 340 can cause data to be loaded, processed, and/or returned to the server computer 320. Specifically, the data plane functions can be accessed using transactions having an address within the range assigned to the application function 354. For example, a transaction can be sent from the server computer 320 to the application logic 340 via the application function 354. Specifically, transactions addressed to the application function 354 can be routed through the peripheral fabric 364 to the application logic 340. Responses from the application logic 340 can be routed through the peripheral fabric 364 to the application function 354, and then back to the server computer 320. Additionally, the data and transactions generated by the application logic 340 can be monitored using a usage and transaction monitoring layer 366. The monitoring layer 366 can potentially identify transactions or data that violate predefined rules and can generate an alert to be sent over the control plane. Additionally or alternatively, the monitoring layer 366 can terminate any transactions generated by the application logic 340 that violate any criteria of the monitoring layer 366. Additionally, the monitoring layer 366 can analyze information moving to or from the application logic 340 so that statistics about the information can be collected and accessed from the control plane.

Data can also be transferred between the server computer 320 and the application logic by programming a direct memory access (DMA) engine 342. The DMA engine 342 can include control and status registers for programming or specifying DMA transfers from a source location to a destination location. As one example, the DMA engine 342 can be programmed to pull information stored within the memory 324 of server computer 320 into the application logic 340 or into the public peripherals of the configurable hardware platform 310. As another example, the DMA engine 342 can be programmed to push data that has been generated by the application logic 340 to the memory 324 of the server computer 320. The data generated by the application logic 340 can be streamed from the application logic 340 or can be written to the public peripherals, such as the memory 381 or storage 382.

The application logic 340 can communicate with other configurable hardware platforms 380. For example, the other configurable hardware platforms 380 can be connected by one or more serial lines that are in communication with the SERDES 312. The application logic 340 can generate transactions to the different configurable hardware platforms 380, and the transactions can be routed through the CHP fabric 344 to the corresponding serial lines (via the SERDES 312) of the configurable hardware platforms 380. Similarly, the application logic 340 can receive information from other configurable hardware platforms 380 using the reverse path.

In sum, the functions of the configurable hardware platform 310 can be categorized as control plane functions and application functions. The control plane functions can be used to monitor and restrict the capabilities of the data plane. The data plane functions can be used to accelerate a user's application that is running on the server computer 320. By separating the functions of the control and data planes, the security and availability of the server computer 320 and other computing infrastructure can potentially be increased. For example, the application logic 340 cannot directly signal onto the physical interconnect 330 because the intermediary layers of the control plane control the formatting and signaling of transactions of the physical interconnect 330. As another example, the application logic 340 can be prevented from using the private peripherals which could be used to reconfigure the configurable hardware platform 310 and/or to access management information that may be privileged. As another example, the application logic 340 can only access hard macros of the configurable hardware platform 310 through intermediary layers so that any interaction between the application logic 340 and the hard macros is controlled using the intermediary layers.

Example Logic Repository Service

Figure 4:
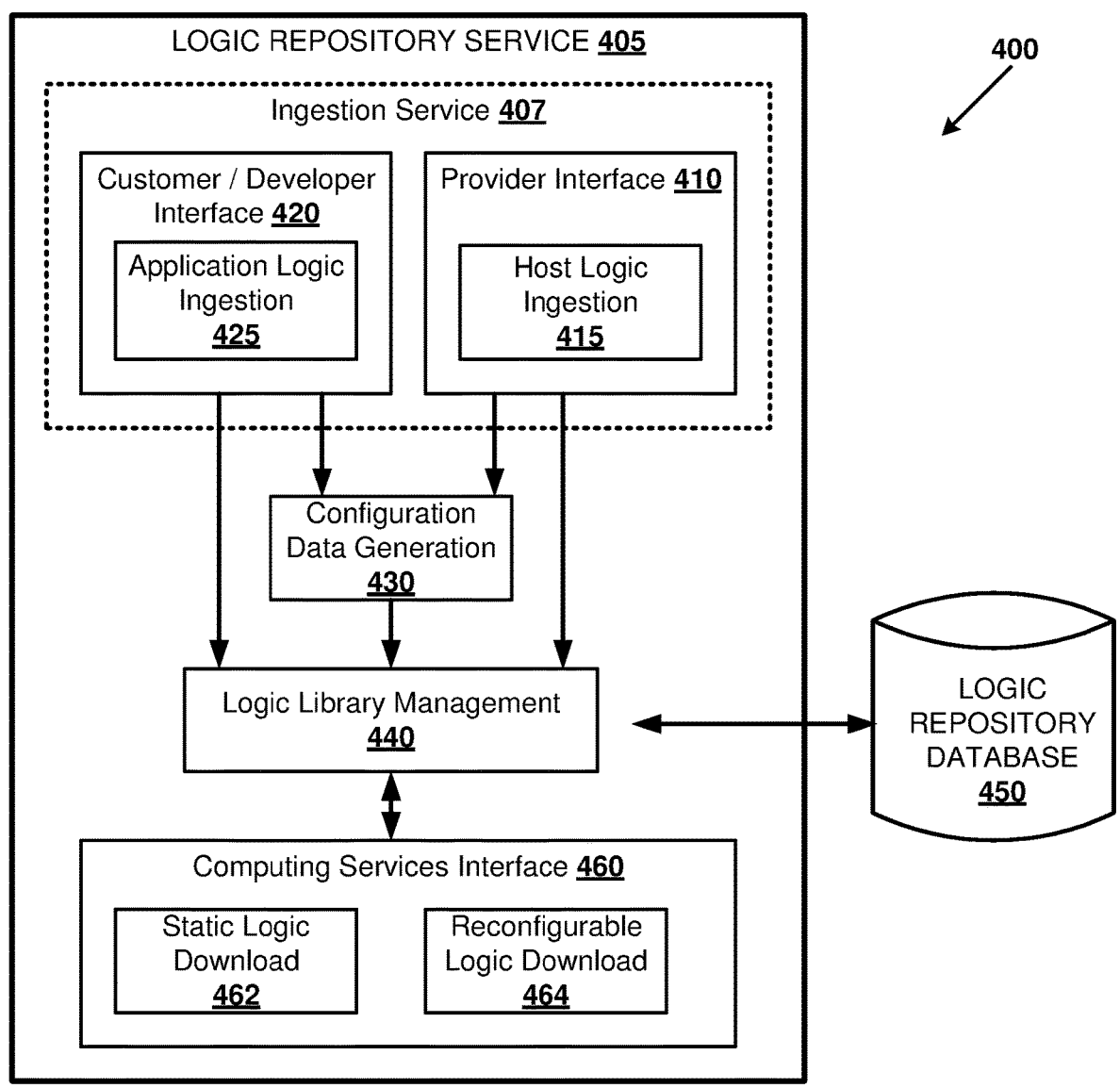
FIG. 4 is a system diagram showing an example architecture of a logic repository service.

FIG. 4 is a system diagram showing an example architecture 400 of a logic repository service 405. The logic repository service 405 can include hardware, software, or a combination of hardware and software. As one example, the logic repository service 405 can be software executing on a server computer managed by a compute services provider. The logic repository service 405 can be accessed through one or more web APIs. The logic repository service 405 can include various components such as an ingestion service 407, a configuration data generation block 430, a logic library management block 440, and a computing services interface 460. Each of the components of the logic repository service 405 can include hardware, software, or a combination of hardware and software. The ingestion service 407 can be used for ingesting a specification for an application logic design and selecting a particular host logic design from a plurality of host logic designs. The configuration data generation block 430 can be used for generating configuration data based on the application logic design and the particular host logic design. The computing services interface 460 can be used for transmitting the configuration data over a network to a server computer in response to a request for the configuration data.

The logic repository service 405 can include a provider interface 410 for servicing API requests by the compute service provider. The provider interface 410 can be used to authenticate that requests are from agents of the compute service provider, such as by authenticating the identity of the requestor using credentials provided in the request. The provider interface 410 can provide host logic ingestion functionality 415. In particular, the provider interface 410 can receive a request to upload a host logic design to the logic repository service 405 and the request can be processed by the host logic ingestion functionality 415. A library of host logic designs can uploaded by uploading multiple host logic designs using the host logic ingestion functionality 415. As described previously, the host logic can include logic for sandboxing the application logic to maintain the security and availability of the computing resources. Additionally, the host logic can be further divided into static logic and reconfigurable logic. The static logic can be configured during an initialization sequence (e.g., at boot time), whereas the reconfigurable logic can be configured at different times during the operation of the configurable logic. As one example, the PCI Express interface can specify that a PCI endpoint be booted and enumerated within about one hundred milliseconds after a reset signal is deasserted. The host logic can be divided into static logic that can be loaded within the allotted time window, and reconfigurable logic that can be loaded after the time window has passed. The static logic can be used as an interface between different reconfigurable regions. The host logic design can be specified using HDL or register transfer logic (RTL) source code, such as Verilog or VHDL. The RTL can be encrypted or non-encrypted. The host logic design can specify features of the design that can be optional for a user of the design. For example, the optional features of the design can be placed within directive pragmas or macro statements (such as 'ifdef statements in Verilog) so that a customer can select the optional features by specifying the macros (such as by setting a variable using the 'define statement) are included. The host logic ingestion module 415 can be used to perform checks on the received host logic design, decrypt the host logic design, and/or provide versioning information for the host logic design. Additionally, the request can include information for associating the host logic design with one or more instance types. For example, some host logic designs may work only with one subset of instance types and other host logic designs may work only with a different subset of instance types. Thus, a library of adaptable host logic designs can be provided by uploading multiple different host logic designs and/or by making features of the individual host logic designs selectable using directive pragmas or macro statements.

The logic repository service 405 can include a customer-developer interface 420 for servicing API requests from the users of the logic repository service 405. The customer-developer interface 420 can be used to authenticate that requests are from users of the compute service provider, such as by authenticating the identity of the requestor using credentials provided in the request. For example, each of the users can be provided with an account that can be used to identify the user for access management, billing, and usage tracking. The users can be limited to viewing and modifying only the logic designs to which they are authorized to access. For example, the users can be prevented from uploading and/or modifying host logic. However, the customer-developer interface 420 can present the users with a list of different host logic designs that the user can select so that the host logic designs can be adapted based on an application design of the user. As one example, the user can define the host logic design to use by selecting the host logic design and/or features of the host logic design from a menu of the customer-developer interface 420. As another example, the user can define the host logic design to use within the API request or by encoding directives in the application design specification. As another example, the host logic design and/or features of the host logic design can be automatically selected by a component of the logic repository service 405 by analyzing interfaces of the application logic, an amount of resources used by the application logic, a reference to an accelerator or peripheral, or other requirements of the application logic.

The customer-developer interface 420 can include application logic ingestion functionality 425 for receiving and/or processing an application logic design. The application logic design can be specified using source code (e.g., HDL or RTL code), a netlist including a list of configurable logic blocks and the connections between the configurable logic blocks, and/or configuration data. For example, the configuration data can include a full or partial bitstream which has been pre-compiled before being uploaded to the logic repository service. The application logic will be combined with host logic (such as by a configuration data generation block 430) to create the logic that can be loaded onto a configurable hardware platform. Processing the application logic design can include translating and/or compiling source code to a lower level format (e.g., compiling OpenCL to generate behavioral or structural Verilog), verifying that required logic and/or signals are present (such as interface signals to the host logic), verifying that known restricted circuits are not present (such as ring oscillators), and other various tasks in preparation for generating configuration data.

The customer-developer interface 420 can accept various types of requests from a user. As one example, a user can request to create a configurable hardware image (CHI). A CHI can provide information for configuring an instance of configurable hardware within a computing environment. For example, a CHI can include one or more compatible instance types, the configuration data for configuring the configurable hardware, access permissions for controlling access to the CHI, and any other information associated with configuring the configurable hardware. The request to create the CHI can include fields for a design description or title, a production status of the design, whether or not the design is encrypted, a reference to source code for the design, a type of source code indicator, an instance type or types that are compatible with the configuration data, and a reference to a location to store reporting information.

As another example, a second request type can be used to retrieve information about CHIs that are associated with the user. In particular, the request can include fields such as a CHI identifier, a machine image (MI) identifier, a product code, an instance type, and an instance identifier. In response to the request, the customer-developer interface 420 can present information about the CHIs that are associated with the user that match one or more of the fields in the request. For example, all CHIs matching the search fields can be listed along with a status associated with each CHI. The CHI can be reported to be in a trial or production state, or in a complete or in-progress state. For example, it can take multiple hours to create a CHI from source code and so this request can be used to check a status of synthesis or implementation of the CHI.

As another example, a third type of request can be to associate a CHI to an MI. An MI can provide information for launching an instance of computing resources within a computing environment. In one embodiment, the instance is a virtual machine executing within a hypervisor executing on a server computer within the computing environment. An MI can include a type of the instance (such as by specifying an architecture, a CPU capability, a co-processor, a peripheral, and/or a configurable hardware design), a template for a root volume (e.g., including an operating system, device drivers, and/or applications) for the instance, and access permissions (e.g., a list of accounts authorized to use the MI) for controlling the accessibility of the MI, and a block device mapping for specifying volumes to attach to the instance when it is launched. By associating an MI to a CHI, the configurable data associated with the CHI can be downloaded to configurable logic of a server computer when a virtual machine based on the MI is launched.

As another example, a fourth type of request can be to publish a CHI to a marketplace. For example, a product code can be associated with the CHI, which can enable the CHI to be listed in a marketplace. The marketplace can be viewable by users of the compute services provider, and can provide a list of hardware accelerator IP that has been developed by one user and is available for license or purchase by another user. When a user buys or licenses a CHI published in the marketplace, the account information of the user can be added to the list of users that can access the CHI.

The configuration data generation block 430 can be used to create configuration data. For example, the configuration data can be based on an application logic design and the host logic design selected by the user. As another example, the configuration data can be based on only an application logic design or only a host logic design. In particular, the configuration data generation block 430 can generate static logic based only on the host logic design. The static logic can be common for the library of the host logic designs. Additionally, the configuration data generation block 430 can generate reconfigurable logic for one or more reconfigurable regions of the configurable logic. For example, the configuration data generation block 430 can be used to generate host reconfigurable logic for a region reserved for host functions. As another example, the configuration data generation block 430 can be used to generate application reconfigurable logic for a region reserved primarily for application functions. As another example, the configuration data generation block 430 can be used to generate the reconfigurable logic for application logic and the host logic design adapted to be used with the application logic.

Inputs to the configuration data generation block 430 can be an application logic design (such as from the application logic ingestion 425), a host logic design (such as from the host logic ingestion 415), and/or constraints describing various implementation details (such as clock frequencies, partitioning information, placement information, a target technology, and so forth). The logic designs can include source code described using an HDL, a netlist, and/or configuration data. The configuration data generation block 430 can combine an application and a host design adapted for the application into one design to create the configuration data. As described in more detail with reference to FIG. 5, the configuration data generation block 430 can include logic synthesis software and place and route software executing on a server computer. Using this software, the configuration data generation block 430 can create configuration data for loading on a configurable hardware platform.

The output from the configuration data generation block 430 can be managed using the logic library management block 440. For example, the logic library management block 440 can associate user information with the configuration data and store the information at the logic repository database 450. The logic library management block 440 can be used to maintain the ownership and versioning of various logic components and source input files. The logic library management block 440 can perform encryption and decryption of the design source code files and of the CHI files so that the files can be stored encrypted at the logic repository database 450. By encrypting the files, the intellectual property of different users can be safeguarded.

The computing services interface 460 can be used as an interface between the logic repository service 405 and computing resources. For example, when an instance is created on the computing resources, an API request can be sent to the computing services interface 460 and configuration data can be downloaded to the requesting resource. A first type of request can be in response to initiating or deploying a new instance on a server computer of the compute resources. For example, the request can be for static logic to load and boot before the configurable logic is enumerated on interconnect of the server computer. In particular, the request can be serviced by the static logic download block 465, which can retrieve configuration data from the logic repository database 450 via the logic library management block 440. The static logic download component 465 can be used to download static logic to the configurable hardware platform on the requesting instance. Additionally, a request can be for reconfigurable logic, and the reconfigurable logic download component 464 can be used to service the request. Specifically, the reconfigurable logic download can retrieve the configuration data through the logic repository database 450 via the logic library management block 440. The request can be for reconfigurable host logic or for reconfigurable application logic. The request for reconfigurable logic can be in response to initiating or deploying a new instance on a server computer of the compute resources. Alternatively, the request for reconfigurable logic can be in response to a client application running on the server computer requesting the reconfigurable logic. For example, an application program running on the server computer can request to have different hardware accelerators downloaded to the configurable hardware platform at different points of the program. The computing services interface 460 can authenticate requests so that only users with access privileges to retrieve the configurable logic data can download the configuration data. For example, the request can include an authorization token, and if the authorization token matches an expected authorization token, the request can be serviced. Otherwise, the request can be denied.

The computing services interface 460 can also be used to receive information from the computing resources. For example, the computing services interface 460 can receive status updates from the computing resources when instances are created, reconfigured, or used on the computing resources. As a specific example, the computing services interface 460 can be notified whether configuration data was successfully deployed on a computing resource. For example, the configuration data may fail to be deployed due to a hardware malfunction or for other reasons. The computing services interface 460, in conjunction with the logic library management block 440, can maintain usage data, failure reports, and/or statistics about the different designs stored in the logic repository database 450. The statistics can be provided to the compute services provider or the user upon demand when a request is received at the provider interface 410 or the customer/developer interface 420, for example.

Figure 5:
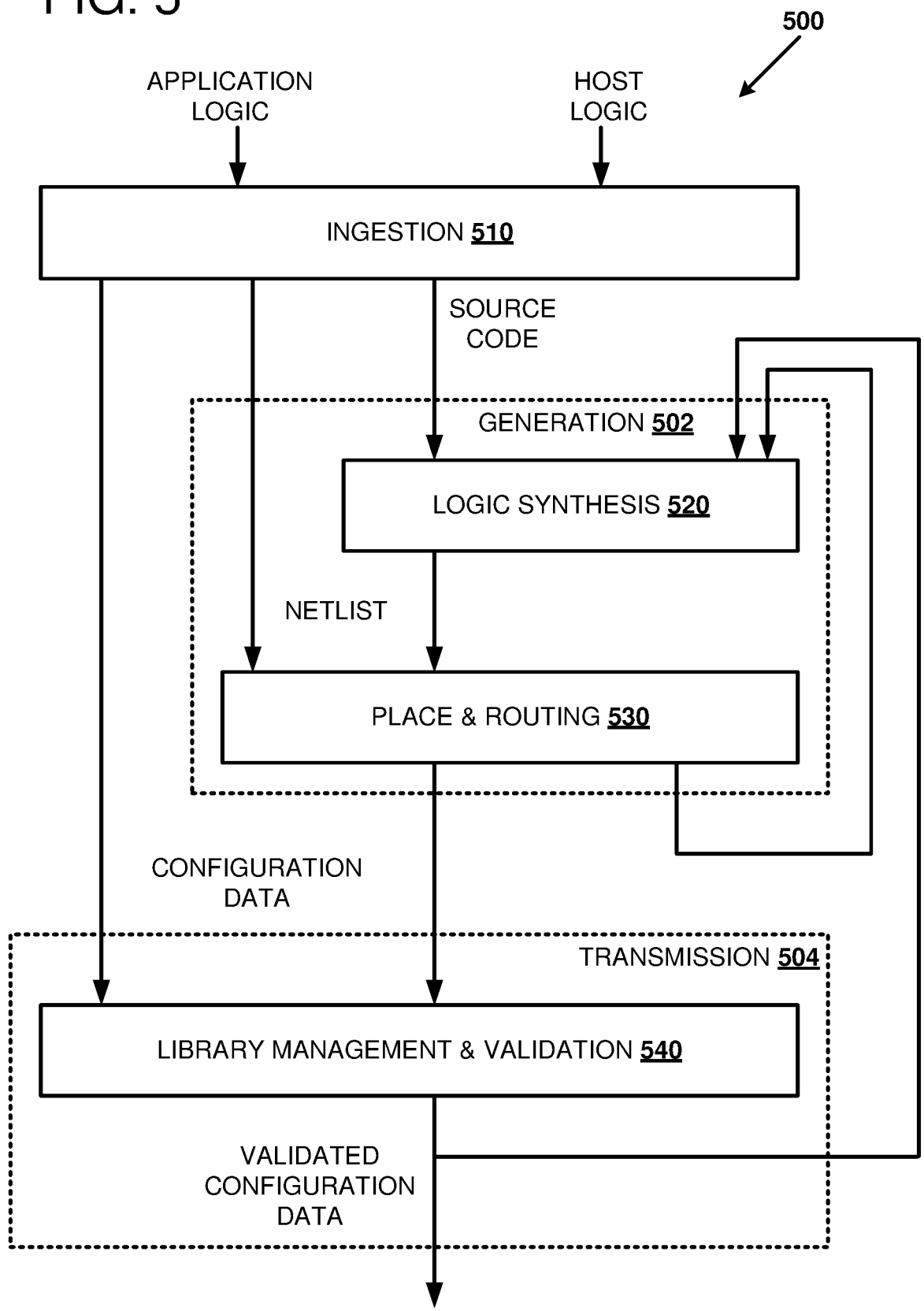
FIG. 5 illustrates an example of ingestion and generation of configuration data as can be performed by a logic repository service.

FIG. 5 illustrates an example method 500 of ingesting logic designs and producing configuration data as can be performed by a logic repository service. The logic repository service can include hardware, software, or a combination of hardware and software. The method 500 can include various steps such as ingestion 510, generation 502, and transmission 504. Each of the steps of the method 500 can be performed using hardware, software, or a combination of hardware and software. The ingestion 510 can include ingesting a specification for an application logic design and selecting a particular host logic design from a plurality of host logic designs. The generation 502 can include generating configuration data based on the application logic design and the particular host logic design. The transmission 504 can include transmitting the configuration data over a network to a server computer in response to a request for the configuration data.

During ingestion 510, an application logic design and/or a host logic design can be received by a logic repository service. The logic design can be encrypted, such as by using the IEEE 1735-2014 encryption standard. The logic design can be decrypted during ingestion 510 or during a later step of the method 500. As one example, source code for the application logic and the host logic can be received during the ingestion 510 and the application logic and the host logic can be combined into a single design to produce source code for logic synthesis 520. The host logic can be adapted based on the application logic using directive pragmas or macro statements included in the specification of the application logic. Additionally or alternatively, the host logic can be adapted by receiving a selection of a particular host logic design from a menu, where the menu presents different host logic designs and/or features to a user during ingestion 510. Additionally or alternatively, the host logic can be adapted by receiving a reference to a host design using an API in a request during ingestion 510.

The logic synthesis 520 can be used to transform a specification (e.g., source code) written in behavioral and/or structural RTL into a netlist based on a target technology. The specifications used to define the application logic and the host logic can be input from the ingestion 510, the generation 502, or the transmission 504 steps of method 500. By using the adaptable host logic, the amount of resources used by the host logic can be increased or decreased depending on the features selected to be included in the host logic. Thus, by decreasing the features in the host logic, more resources can be available for the application logic. The logic synthesis 520 can target different configurable logic technologies, such as FPGAs having different architectures, manufacturing processes, capacities, and/or manufacturers. The netlist can include a number of configurable logic blocks, non-configurable blocks (e.g., hard macros), and the connections between the different blocks. The netlist can be a logical netlist where blocks of the netlist are enumerated but unplaced within the target technology. The netlist can be used as input to place and route 530. The place and route 530 can take the instances of the configurable blocks from the netlist and the routing information, and map the blocks to a physical device. The place and route 530 can generate data for programming a programmable interconnect that connects the blocks within the physical device. Thus, the place-and-routed design can include a physical mapping for each of the logical components of the netlist and the connections between the different logical components. Additionally or alternatively, the place and route 530 can be timing driven so that the netlist is modified based on timing constraints of the design and the physical constraints of the physical device. The output of the place and route 530 can be configuration data, such as a bitstream image. The configuration data can be partitioned or divided into different components. For example, the configuration data can include data associated with static host logic, reconfigurable host logic, and/or reconfigurable application logic. The different components can be overlapping or non-overlapping. For example, the static host logic can be routed through regions that are used by the reconfigurable application logic. Thus, a partial bitstream for the reconfigurable application logic can also include portions of the static host logic.

As another example, a netlist for the application logic and/or the host logic can be received during the ingestion 510. As a specific example, a netlist can be received for the application logic and source code can be received for the host logic. In this case, the host logic can be synthesized with the logic synthesis 520 to generate a netlist for the host logic, and the netlists for the host and application logic can be combined into a single design to produce a netlist for the place and route 530. As another example, configuration data for the application logic and/or the host logic can be received during the ingestion 510. For example, a partial bitstream for the application logic design can be received, or a full bitstream for the host and application logic design can be received.

The logic repository service can also include library management and validation 540 functionality. For example, each step of the method 500 can generate intermediate data and/or files that can be stored in a database. In particular, the database can be indexed by a developer's account identifier, so that the developer can access source code, reports, and configuration data associated with the developer. As one example, source code for application logic can be associated with a developer's account identifier during ingestion 510. The source code can be associated with a version identifier that is provided by the developer or generated during ingestion 510. Multiple versions of source code can be maintained for an account and stored within the database. Each version of the application logic can be associated with a version of the host logic that is adapted for the particular application logic design. Each version of configuration data can correspond to a particular version of the application logic and a particular version of the host logic. A bitstream or CHI identifier can be created when configuration data is generated, and the source code, netlist, and reports can be labelled with the CHI identifier. The reports can be generated at the various steps of the method 500 to provide information about the logic designs. For example, one or more synthesis reports can be generated by the logic synthesis 520 and one or more reports can be generated by the place and routing 530. As one example, an implementation report can be generated to provide information about a utilization of the logic designs. In particular, a percentage of the hardware resources used by the design can be provided so that the design can be implemented on appropriate instance types.

As another example, a timing report can provide a static timing analysis showing whether the design meets timing specifications of the configurable hardware. The logic synthesis 520 and the place and route 530 can involve random, non-deterministic steps that vary with each run of the tools so that each run of the logic synthesis 520 and the place and route 530 may provide different results. Thus, if a developer has a design that does not meet timing (as indicated by the timing report), the developer may desire to rerun the logic synthesis 520 and/or the place and route 530. In this manner, the developer can iterate on their design by executing multiple synthesis and routing runs for the same design. When one of the synthesis and place and route runs yields results that meet the timing specifications of the configurable hardware logic, the developer can mark that run as a production run. For example, the developer can change the status of the CHI generated from that run to production and can associate a bitstream identifier with the generated configuration data.

The library management and validation 540 functionality can be used to validate the user designs for the configurable logic at various points during the development and deployment steps. As one example, the validation 540 can include performing simulations to verify whether the application logic is compatible with the host logic so that the host logic can constrain the functionality of the application logic. The validation 540 can include comparing a netlist of the application logic and confirming that the application logic meets capacity and area restraints of the configurable hardware platform. For example, the application logic can be restricted to use only logic within one or more reconfigurable regions. If the application logic is outside of those regions, then the application logic can be rejected. Additionally, the application logic can be ingested as a bitstream, and the bitstream can be validated by the validation 540. The validation of a bitstream can include comparing a portion of the ingested bitstream data corresponding to the host logic to a baseline version of the host logic to confirm that the host logic is not corrupted. The output from the validation block 540 can be validated configuration data.

Example Network-based Compute Service Provider

Figure 6:
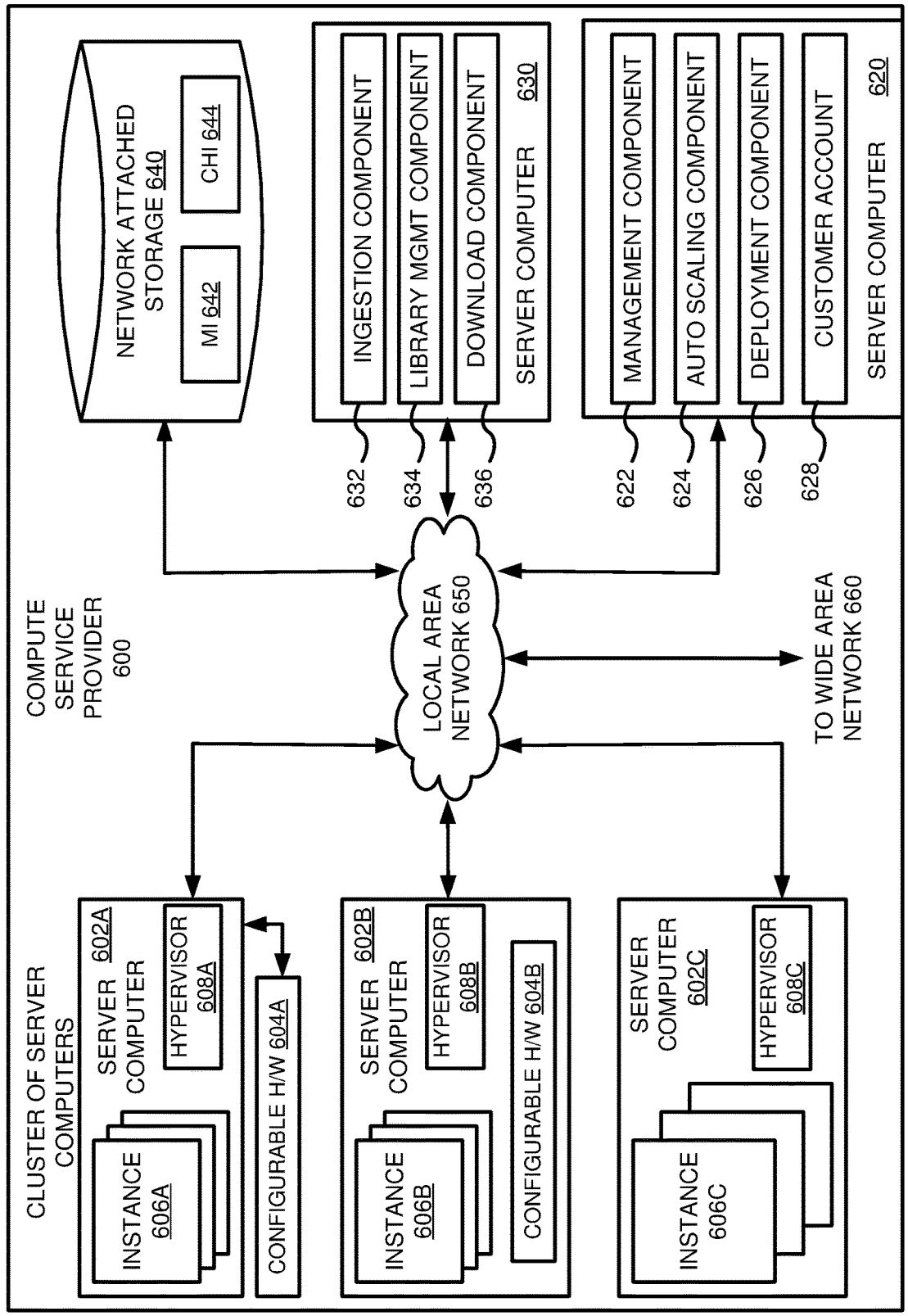
FIG. 6 is a system diagram showing an example of a plurality of virtual machine instances running in a multi-tenant environment including a logic repository service.

FIG. 6 is a computing system diagram of a network-based compute service provider 600 that illustrates one environment in which embodiments described herein can be used. By way of background, the compute service provider 600 (i.e., the cloud provider) is capable of delivery of computing and storage capacity as a service to a community of end recipients. In an example embodiment, the compute service provider can be established for an organization by or on behalf of the organization. That is, the compute service provider 600 may offer a "private cloud environment." In another embodiment, the compute service provider 600 supports a multi-tenant environment, wherein a plurality of customers operate independently (i.e., a public cloud environment). Generally speaking, the compute service provider 600 can provide the following models: Infrastructure as a Service ("IaaS"), Platform as a Service ("PaaS"), and/or Software as a Service ("SaaS"). Other models can be provided. For the IaaS model, the compute service provider 600 can offer computers as physical or virtual machines and other resources. The virtual machines can be run as guests by a hypervisor, as described further below. The PaaS model delivers a computing platform that can include an operating system, programming language execution environment, database, and web server. Application developers can develop and run their software solutions on the compute service provider platform without the cost of buying and managing the underlying hardware and software. Additionally, application developers can develop and run their hardware solutions on configurable hardware of the compute service provider platform. The SaaS model allows installation and operation of application software in the compute service provider. In some embodiments, end users access the compute service provider 600 using networked client devices, such as desktop computers, laptops, tablets, smartphones, etc. running web browsers or other lightweight client applications. Those skilled in the art will recognize that the compute service provider 600 can be described as a "cloud" environment.

The particular illustrated compute service provider 600 includes a plurality of server computers 602A-602C. While only three server computers are shown, any number can be used, and large centers can include thousands of server computers. The server computers 602A-602C can provide computing resources for executing software instances 606A-606C. In one embodiment, the software instances 606A-606C are virtual machines. As known in the art, a virtual machine is an instance of a software implementation of a machine (i.e. a computer) that executes applications like a physical machine. In the example of a virtual machine, each of the servers 602A-602C can be configured to execute a hypervisor 608 or another type of program configured to enable the execution of multiple software instances 606 on a single server. Additionally, each of the software instances 606 can be configured to execute one or more applications.

It should be appreciated that although the embodiments disclosed herein are described primarily in the context of virtual machines, other types of instances can be utilized with the concepts and technologies disclosed herein. For instance, the technologies disclosed herein can be utilized with storage resources, data communications resources, and with other types of computing resources. The embodiments disclosed herein might also execute all or a portion of an application directly on a computer system without utilizing virtual machine instances.

The server computers 602A-602C can include a heterogeneous collection of different hardware resources or instance types. Some of the hardware instance types can include configurable hardware that is at least partially configurable by a user of the compute service provider 600. One example of an instance type can include the server computer 602A which is in communication with configurable hardware 604A. Specifically, the server computer 602A and the configurable hardware 604A can communicate over a local interconnect such as PCIe. Another example of an instance type can include the server computer 602B and configurable hardware 604B. For example, the configurable logic 604B can be integrated within a multi-chip module or on the same die as a CPU of the server computer 602B. Yet another example of an instance type can include the server computer 602C without any configurable hardware. Thus, hardware instance types with and without configurable logic can be present within the resources of the compute service provider 600.

One or more server computers 620 can be reserved for executing software components for managing the operation of the server computers 602 and the software instances 606. For example, the server computer 620 can execute a management component 622. A customer can access the management component 622 to configure various aspects of the operation of the software instances 606 purchased by the customer. For example, the customer can purchase, rent or lease instances and make changes to the configuration of the software instances. The configuration information for each of the software instances can be stored as a machine image (MI) 642 on the network-attached storage 640. Specifically, the MI 642 describes the information to launch a VM instance. The MI can include a template for a root volume of the instance (e.g., an OS and applications), launch permissions for controlling which customer accounts can use the MI, and a block device mapping which specifies volumes to attach to the instance when the instance is launched. The MI can also include a reference to a configurable hardware image (CHI) 642 which is to be loaded on configurable hardware 604 when the instance is launched. The CHI includes configuration data for programming or configuring at least a portion of the configurable hardware 604.

The customer can also specify settings regarding how the purchased instances are to be scaled in response to demand. The management component can further include a policy document to implement customer policies. An auto scaling component 624 can scale the instances 606 based upon rules defined by the customer. In one embodiment, the auto scaling component 624 allows a customer to specify scale-up rules for use in determining when new instances should be instantiated and scale-down rules for use in determining when existing instances should be terminated. The auto scaling component 624 can consist of a number of subcomponents executing on different server computers 602 or other computing devices. The auto scaling component 624 can monitor available computing resources over an internal management network and modify resources available based on need.

A deployment component 626 can be used to assist customers in the deployment of new instances 606 of computing resources. The deployment component can have access to account information associated with the instances, such as who is the owner of the account, credit card information, country of the owner, etc. The deployment component 626 can receive a configuration from a customer that includes data describing how new instances 606 should be configured. For example, the configuration can specify one or more applications to be installed in new instances 606, provide scripts and/or other types of code to be executed for configuring new instances 606, provide cache logic specifying how an application cache should be prepared, and other types of information. The deployment component 626 can utilize the customer-provided configuration and cache logic to configure, prime, and launch new instances 606. The configuration, cache logic, and other information may be specified by a customer using the management component 622 or by providing this information directly to the deployment component 626. The instance manager can be considered part of the deployment component.

Customer account information 628 can include any desired information associated with a customer of the multi-tenant environment. For example, the customer account information can include a unique identifier for a customer, a customer address, billing information, licensing information, customization parameters for launching instances, scheduling information, auto-scaling parameters, previous IP addresses used to access the account, a listing of the MI's and CHI's accessible to the customer, etc.

One or more server computers 630 can be reserved for executing software components for managing the download of configuration data to configurable hardware 604 of the server computers 602. For example, the server computer 630 can execute a logic repository service comprising an ingestion component 632, a library management component 634, and a download component 636. The ingestion component 632 can receive host logic and application logic designs or specifications and generate configuration data that can be used to configure the configurable hardware 604. The library management component 634 can be used to manage source code, user information, and configuration data associated with the logic repository service. For example, the library management component 634 can be used to store configuration data generated from a user's design in a location specified by the user on the network-attached storage 640. In particular, the configuration data can be stored within a configurable hardware image 642 on the network-attached storage 640. Additionally, the library management component 634 can manage the versioning and storage of input files (such as the specifications for the application logic and the host logic) and metadata about the logic designs and/or the users of the logic repository service. The library management component 634 can index the generated configuration data by one or more properties such as a user identifier, an instance type, a marketplace identifier, a machine image identifier, and a configurable hardware identifier, for example. The download component 636 can be used to authenticate requests for configuration data and to transmit the configuration data to the requestor when the request is authenticated. For example, agents on the server computers 602A-B can send requests to the download component 636 when the instances 606 are launched that use the configurable hardware 604. As another example, the agents on the server computers 602A-B can send requests to the download component 636 when the instances 606 request that the configurable hardware 604 be partially reconfigured while the configurable hardware 604 is in operation.

The network-attached storage (NAS) 640 can be used to provide storage space and access to files stored on the NAS 640. For example, the NAS 640 can include one or more server computers used for processing requests using a network file sharing protocol, such as Network File System (NFS). The NAS 640 can include removable or non-removable media, including magnetic disks, storage area networks (SANs), redundant arrays of independent disks (RAID), magnetic tapes or cassettes, CD-ROMs, DVDs, or any other medium which can be used to store information in a non-transitory way and which can be accessed over the network 650.

The network 650 can be utilized to interconnect the server computers 602A-602C, the server computers 620 and 630, and the storage 640. The network 650 can be a local area network (LAN) and can be connected to a Wide Area Network (WAN) 660 so that end users can access the compute service provider 600. It should be appreciated that the network topology illustrated in FIG. 6 has been simplified and that many more networks and networking devices can be utilized to interconnect the various computing systems disclosed herein.

Figure 7:
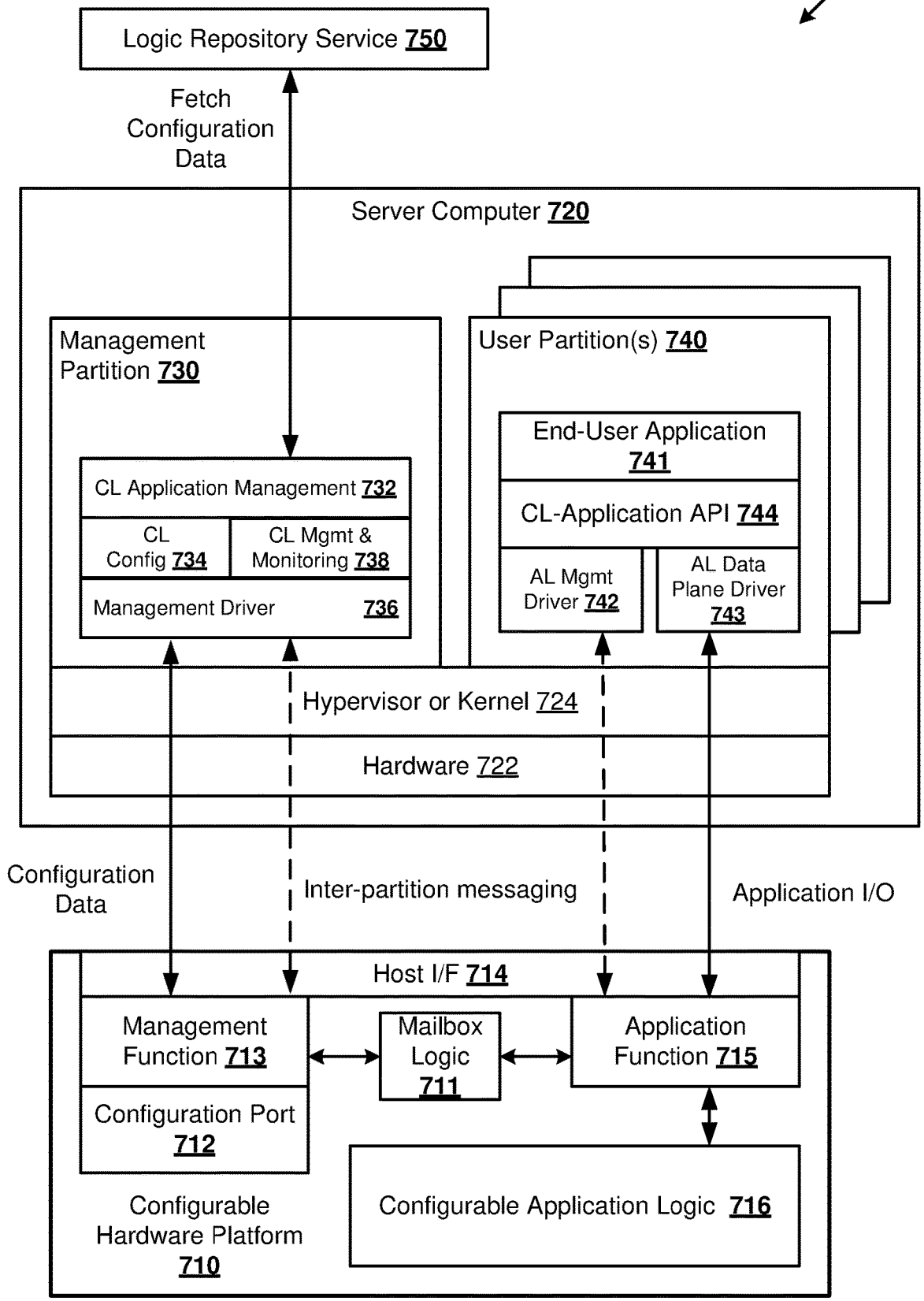
FIG. 7 shows further details of the example system of FIG. 6 including components of a control plane and a data plane for configuring and interfacing to a configurable hardware platform.

FIG. 7 shows further details of an example system 700 including components of a control plane and a data plane for configuring and interfacing to a configurable hardware platform 710. The control plane includes functions for initializing, monitoring, reconfiguring, and tearing down the configurable hardware platform 710. The data plane includes functions for communicating between a user's application and the configurable hardware platform 710. The control plane can be accessible by users or services having a higher privilege level and the data plane can be accessible by users or services having a lower privilege level. In one embodiment, the configurable hardware platform 710 is connected to a server computer 720 using a local interconnect, such as PCIe. In an alternative embodiment, the configurable hardware platform 710 can be integrated within the hardware of the server computer 720. As one example, the server computer 720 can be one of the plurality of server computers 602A-602B of the compute service provider 600 of FIG. 6.

The server computer 720 has underlying hardware 722 including one or more CPUs, memory, storage devices, interconnection hardware, etc. Running a layer above the hardware 722 is a hypervisor or kernel layer 724. The hypervisor or kernel layer can be classified as a type 1 or type 2 hypervisor. A type 1 hypervisor runs directly on the host hardware 722 to control the hardware and to manage the guest operating systems. A type 2 hypervisor runs within a conventional operating system environment. Thus, in a type 2 environment, the hypervisor can be a distinct layer running above the operating system and the operating system interacts with the system hardware. Different types of hypervisors include Xen-based, Hyper-V, ESXi/ESX, Linux, etc., but other hypervisors can be used. A management partition 730 (such as Domain 0 of the Xen hypervisor) can be part of the hypervisor or separated therefrom and generally includes device drivers needed for accessing the hardware 722. User partitions 740 are logical units of isolation within the hypervisor. Each user partition 740 can be allocated its own portion of the hardware layer's memory, CPU allocation, storage, interconnect bandwidth, etc. Additionally, each user partition 740 can include a virtual machine and its own guest operating system. As such, each user partition 740 is an abstract portion of capacity designed to support its own virtual machine independent of the other partitions.

The management partition 730 can be used to perform management services for the user partitions 740 and the configurable hardware platform 710. The management partition 730 can communicate with web services (such as a deployment service, a logic repository service 750, and a health monitoring service) of the compute service provider, the user partitions 740, and the configurable hardware platform 710. The management services can include services for launching and terminating user partitions 740, and configuring, reconfiguring, and tearing down the configurable logic of the configurable hardware platform 710. As a specific example, the management partition 730 can launch a new user partition 740 in response to a request from a deployment service (such as the deployment component 626 of FIG. 6). The request can include a reference to an MI and/or a CHI. The MI can specify programs and drivers to load on the user partition 740 and the CHI can specify configuration data to load on the configurable hardware platform 710. The management partition 730 can initialize the user partition 740 based on the information associated with the MI and can cause the configuration data associated with the CHI to be loaded onto the configurable hardware platform 710. The initialization of the user partition 740 and the configurable hardware platform 710 can occur concurrently so that the time to make the instance operational can be reduced.

The management partition 730 can be used to manage programming and monitoring of the configurable hardware platform 710. By using the management partition 730 for this purpose, access to the configuration data and the configuration ports of the configurable hardware platform 710 can be restricted. Specifically, users with lower privilege levels can be restricted from directly accessing the management partition 730. Thus, the configurable logic cannot be modified without using the infrastructure of the compute services provider and any third party IP used to program the configurable logic can be protected from viewing by unauthorized users.

The management partition 730 can include a software stack for the control plane to configure and interface to a configurable hardware platform 710. The control plane software stack can include a configurable logic (CL) application management layer 732 for communicating with web services (such as the logic repository service 750 and a health monitoring service), the configurable hardware platform 710, and the user partitions 740. For example, the CL application management layer 732 can issue a request to the logic repository service 750 to fetch configuration data in response to a user partition 740 being launched. The CL application management layer 732 can communicate with the user partition 740 using shared memory of the hardware 722 or by sending and receiving inter-partition messages over the interconnect connecting the server computer 720 to the configurable hardware platform 710. Specifically, the CL application management layer 732 can read and write messages to mailbox logic 711 of the configurable hardware platform 710. The messages can include requests by an end-user application 741 to reconfigure or tear-down the configurable hardware platform 710. The CL application management layer 732 can issue a request to the logic repository service 750 to fetch configuration data in response to a request to reconfigure the configurable hardware platform 710. The CL application management layer 732 can initiate a tear-down sequence in response to a request to tear down the configurable hardware platform 710. The CL application management layer 732 can perform watchdog related activities to determine whether the communication path to the user partition 740 is functional.

The control plane software stack can include a CL configuration layer 734 for accessing the configuration port 712 (e.g., a configuration access port) of the configurable hardware platform 710 so that configuration data can be loaded onto the configurable hardware platform 710. For example, the CL configuration layer 734 can send a command or commands to the configuration port 712 to perform a full or partial configuration of the configurable hardware platform 710. The CL configuration layer 734 can send the configuration data (e.g., a bitstream) to the configuration port 712 so that the configurable logic can be programmed according to the configuration data. The configuration data can specify host logic and/or application logic.

The control plane software stack can include a management driver 736 for communicating over the physical interconnect connecting the server computer 720 to the configurable hardware platform 710. The management driver 736 can encapsulate commands, requests, responses, messages, and data originating from the management partition 730 for transmission over the physical interconnect. Additionally, the management driver 736 can de-encapsulate commands, requests, responses, messages, and data sent to the management partition 730 over the physical interconnect. Specifically, the management driver 736 can communicate with the management function 713 of the configurable hardware platform 710. For example, the management function 713 can be a physical or virtual function mapped to an address range during an enumeration of devices connected to the physical interconnect. The management driver 736 can communicate with the management function 713 by addressing transactions to the address range assigned to the management function 713.

The control plane software stack can include a CL management and monitoring layer 738. The CL management and monitoring layer 738 can monitor and analyze transactions occurring on the physical interconnect to determine a health of the configurable hardware platform 710 and/or to determine usage characteristics of the configurable hardware platform 710. For example, the CL management and monitoring layer 738 can monitor whether configuration data is successfully deployed on the configurable hardware platform 710 and can cause a report to be transmitted to the logic repository service 750 indicating the status of the deployment.

The configurable hardware platform 710 can include non-configurable hard macros and configurable logic. The hard macros can perform specific functions within the configurable hardware platform 710, such as input/output blocks (e.g., serializer and deserializer (SERDES) blocks and gigabit transceivers), analog-to-digital converters, memory control blocks, test access ports, and a configuration port 712. The configurable logic can be programmed or configured by loading configuration data onto the configurable hardware platform 710. For example, the configuration port 712 can be used for loading the configuration data. As one example, configuration data can be stored in a memory (such as a Flash memory) accessible by the configuration port 712 and the configuration data can be automatically loaded during an initialization sequence (such as during a power-on sequence) of the configurable hardware platform 710. Additionally, the configuration port 712 can be accessed using an off-chip processor or an interface within the configurable hardware platform 710.

The configurable logic can be programmed to include host logic and application logic. The host logic can shield the interfaces of at least some of the hard macros from the end-users so that the end-users have limited access to the hard macros and to the physical interconnect. For example, the host logic can include the mailbox logic 711, the configuration port 712, the management function 713, the host interface 714, and the application function 715. The end-users can cause the configurable application logic 716 to be loaded on the configurable hardware platform 710, and can communicate with the configurable application logic 716 from the user partitions 740 (via the application function 715).

The host interface logic 714 can include circuitry (e.g., hard macros and/or configurable logic) for signaling on the physical interconnect and implementing a communications protocol. The communications protocol specifies the rules and message formats for communicating over the interconnect. The application function 715 can be used to communicate with drivers of the user partitions 740. Specifically, the application function 715 can be a physical or virtual function mapped to an address range during an enumeration of devices connected to the physical interconnect. The application drivers can communicate with the application function 715 by addressing transactions to the address range assigned to the application function 715. Specifically, the application function 715 can communicate with an application logic management driver 742 to exchange commands, requests, responses, messages, and data over the control plane. The application function 715 can communicate with an application logic data plane driver 743 to exchange commands, requests, responses, messages, and data over the data plane.

The mailbox logic 711 can include one or more buffers and one or more control registers. For example, a given control register can be associated with a particular buffer and the register can be used as a semaphore to synchronize between the management partition 730 and the user partition 740. As a specific example, if a partition can modify a value of the control register, the partition can write to the buffer. The buffer and the control register can be accessible from both the management function 713 and the application function 715. When the message is written to the buffer, another control register (e.g., the message ready register) can be written to indicate the message is complete. The message ready register can polled by the partitions to determine if a message is present, or an interrupt can be generated and transmitted to the partitions in response to the message ready register being written.

The user partition 740 can include a software stack for interfacing an end-user application 740 to the configurable hardware platform 710. The application software stack can include functions for communicating with the control plane and the data plane. Specifically, the application software stack can include a CL-Application API 744 for providing the end-user application 740 with access to the configurable hardware platform 710. The CL-Application API 744 can include a library of methods or functions for communicating with the configurable hardware platform 710 and the management partition 730. For example, the end-user application 741 can send a command or data to the configurable application logic 716 by using an API of the CL-Application API 744. In particular, the API of the CL-Application API 744 can interface with the application logic (AL) data plane driver 743 which can generate a transaction targeted to the application function 715 which can communicate with the configurable application logic 716. In this manner, the end-user application 741 can cause the configurable application logic 716 receive, process, and/or respond with data to potentially accelerate tasks of the end-user application 741. As another example, the end-user application 741 can send a command or data to the management partition 730 by using an API of the CL-Application API 744. In particular, the API of the CL-Application API 744 can interface with the AL management driver 742 which can generate a transaction targeted to the application function 715 which can communicate with the mailbox logic 711. In this manner, the end-user application 741 can cause the management partition 730 to provide operational or metadata about the configurable hardware platform 710 and/or to request that the configurable application logic 716 be reconfigured.

The application software stack in conjunction with the hypervisor or kernel 724 can be used to limit the operations available to perform over the physical interconnect by the end-user application 741. For example, the compute services provider can provide the AL management driver 742, the AL data plane driver 743, and the CL-Application API 744 (such as by associating the files with a machine image). These components can be protected from modification by only permitting users and services having a higher privilege level than the end-user to write to the files. The AL management driver 742 and the AL data plane driver 743 can be restricted to using only addresses within the address range of the application function 715. Additionally, an input/output memory management unit (I/O MMU) can restrict interconnect transactions to be within the address ranges of the application function 715 or the management function 713.

Figure 8:
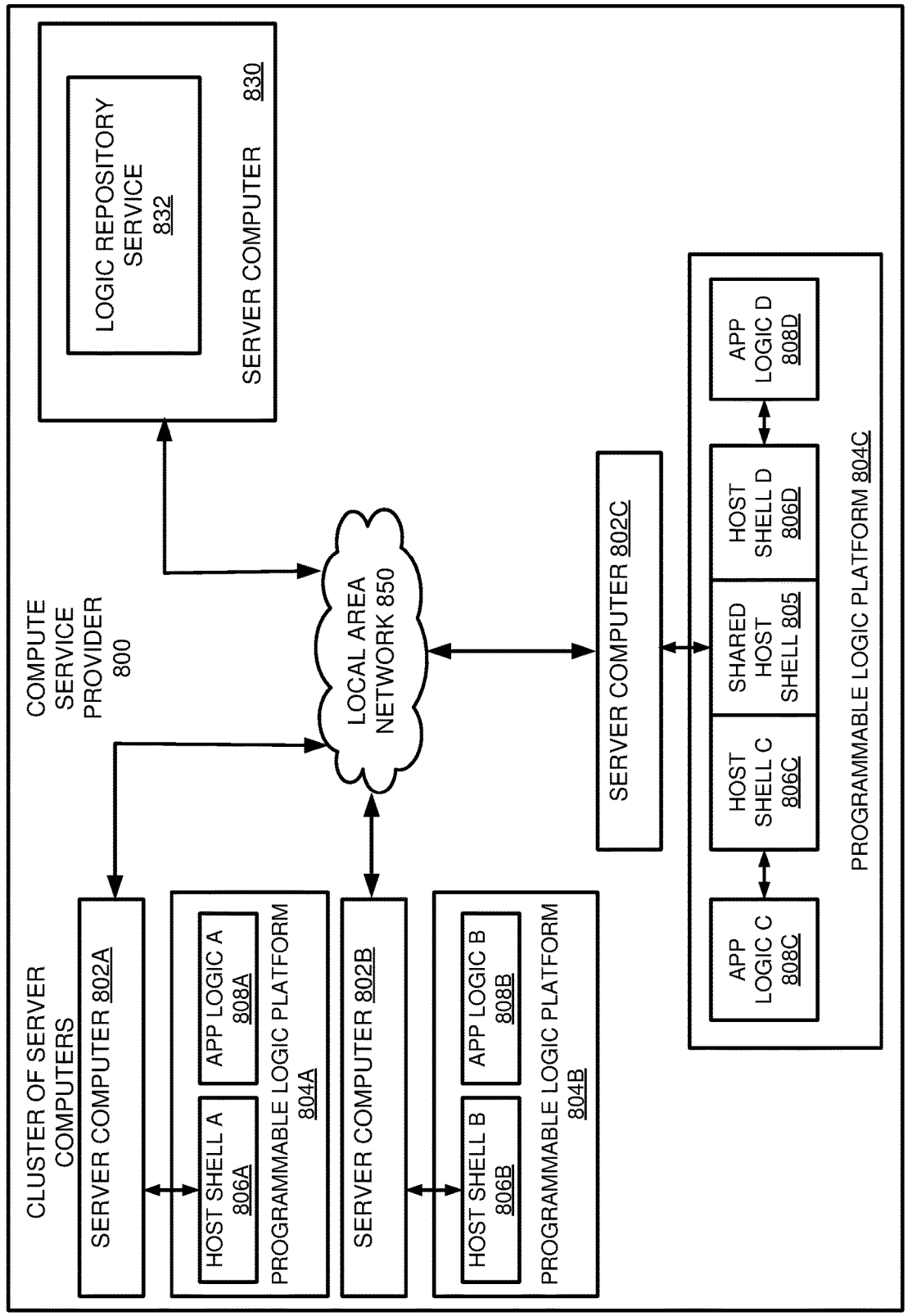
FIG. 8 is a system diagram showing another example of a plurality of virtual machine instances running in a multi-tenant environment including a logic repository service.

FIG. 8 is a system diagram showing an example of a plurality of compute instances running in a multi-tenant environment including a logic repository service. For example, the compute service provider 800 can provide computing and storage capacity as a service to a community of end recipients. Specifically, the compute service provider 800 can support a multi-tenant environment, where a plurality of customers operate independently using different virtual machine instances executing on server computers that are allocated for single or multiple customers. The server computers can include programmable logic platforms having configurable hardware that is shared among different customers and/or reserved for a single customer.

A network-based service (e.g., the logic repository service 832 executing on server computer 830 and accessible over the network 850) can be configured to manage an allocation of instances of configurable hardware from a pool of programmable logic platforms in communication with the network-based service. As one example, the logic repository service 832 can communicate with the pool of server computers 802A-802C which are in local communication with the programmable logic platforms 804A-804C, respectively. The server computers 802A-802C can be allocated by a provisioning or deployment service (not shown) when a customer requests compute resources. When the customer request includes a request for configurable hardware, the logic repository service 832 can transmit configuration data corresponding to the request to the server computer assigned to the customer.

As a specific example, an instance of compute resources including the server computer 802A and the programmable logic platform 804A can be allocated to customer A. The programmable logic platform 804A can be configured, using the logic repository service 832, with application logic design 808A encapsulated by a host logic shell 806A. The host logic shell 806A can be adapted based on the application logic design 808A. For example, the compute service provider 800 can design the host logic shell 806A so that it has both mandatory features and optional features that can be enabled or disabled by a customer. Customer A can customize the host logic shell 806A (such as by enabling or disabling different features of the host logic shell 806A) during a design phase of the application logic design 808A, and configuration data for the customized host logic shell 806A can be downloaded when compute resources are allocated for the customer.

As another example, an instance of compute resources including the server computer 802B and the programmable logic platform 804B can be allocated to customer B. The programmable logic platform 804B can be configured, using the logic repository service 832, with application logic design 808B encapsulated by a host logic shell 806B. The host logic shell 806B can be adapted based on the application logic design 808B, so that the host logic shell 806B is different from the host logic shell 806A. For example, the host logic shell 806B can have different optional features enabled and/or disabled than the host logic shell 806A.

As another example, customers can be assigned to the same server computer and programmable logic platform when compute resources are allocated to the customers. In particular, customers C and D can be assigned to the server computer 802C and the programmable logic platform 804C. The programmable logic platform 804C can be configured for customer C, using the logic repository service 832, with application logic design 808C encapsulated by a host logic shell 806C. Similarly, the programmable logic platform 804C can be configured for customer D, using the logic repository service 832, with application logic design 808D encapsulated by a host logic shell 806D. The host logic shells 806A-D can all be different, based on the respective application logic of the respective customers. The host logic shell 806C can share logic resources (e.g., shared host shell 805) with the host logic shell 806D. As one example, the shared host shell 805 can be static logic that is configured during an initialization sequence of the programmable logic platform 804C, and the host logic shells 806C and D can be reconfigurable logic that is configured in response to requests from the respective customers. For example, the shared host shell 805 can include host interface logic for communicating with the server computer 802C, controls for reconfiguring the programmable logic platform 804C, and protection logic for preventing the application logic from directly accessing external pins of the programmable logic platform 804C without going through an intermediary interface.

Additionally, particular compute resources can be reconfigured for different customers. As a specific example, when the customer B finishes with the compute resources including the server computer 802B and the programmable logic platform 804B, the programmable logic platform 804B can be reconfigured, using the logic repository service 832, with a different application logic design encapsulated by a different host logic shell for a different customer E. Specifically, the customer E can be assigned to the server computer 802B and the programmable logic platform 804B. The programmable logic platform 804B can be configured, using the logic repository service 832, with an application logic design from customer E that is encapsulated by a host logic shell selected by customer E. Thus, the host logic shell can be morphed or changed during the operation of the programmable logic platform 804B so that different customers can use different host logic shells that are adapted based on the application logic of the respective customers.

Example Methods

Figure 9:
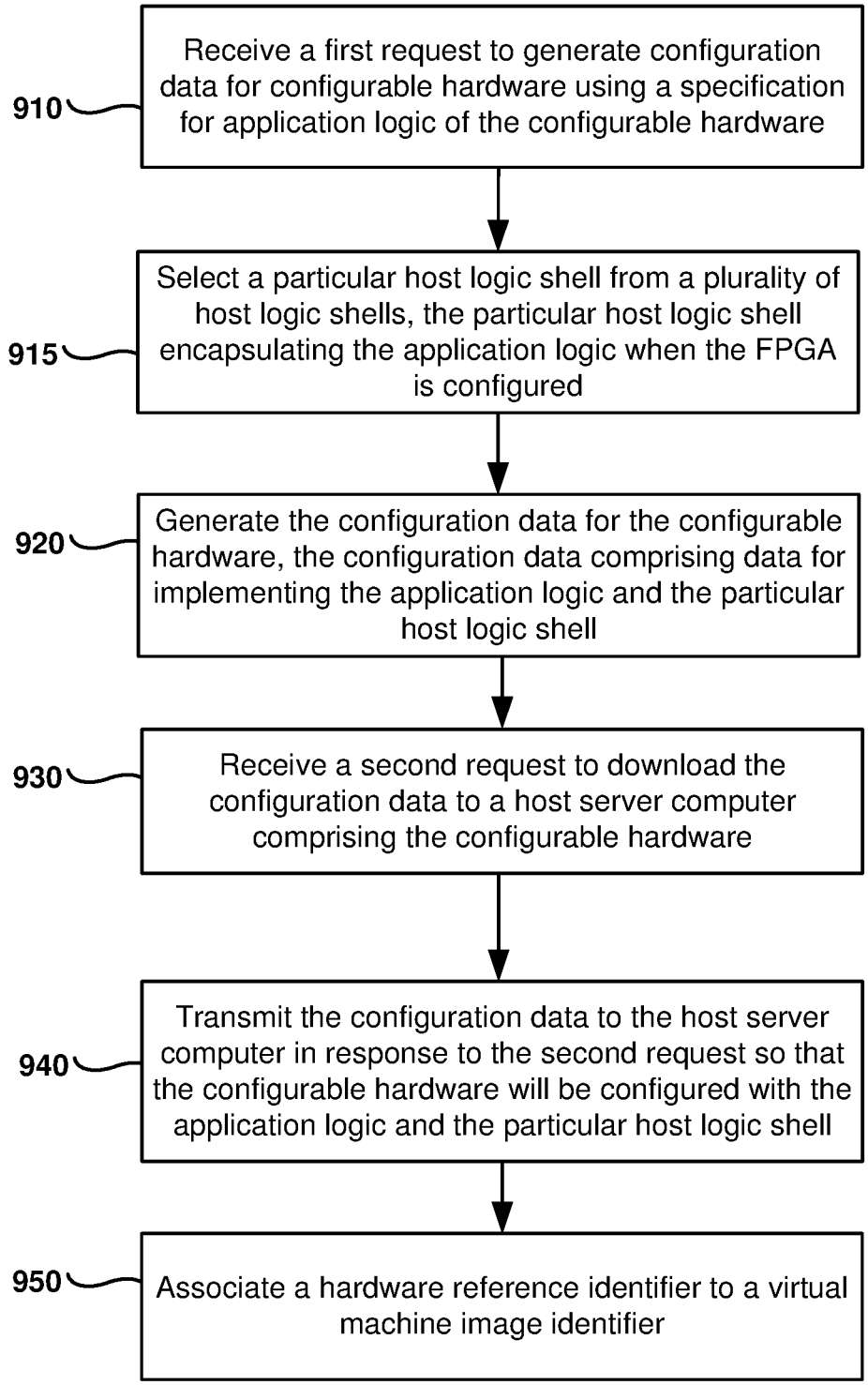
FIG. 9 is a flow diagram of an example method of managing configuration data for configuring configurable hardware in a multi-tenant environment.

FIG. 9 is a flow diagram of an example method 900 for managing configuration data that can be used to configure or program configurable hardware in, for example, a multi-tenant environment. As one example, the method 900 can be implemented using a logic repository service, such as described with reference to FIGS. 1 and 4-5.

At 910, a first request can be received to generate configuration data for configurable hardware using a specification for application logic of the configurable hardware. The specification for the application logic can include source code (e.g., HDL or RTL source code), a netlist, and/or configuration data corresponding to the application logic. The request can specify an instance type associated with the configuration data. The request can include an access list indicating users that can access the configuration data.

At 915, a particular host logic shell can be selected from a plurality of host logic shells. For example the first request (from 910) can include a reference to a version of host logic to use with the application logic. The version of the host logic can refer to a specification for the particular host logic shell. Additionally or alternatively, the first request can specify a set of features (e.g., a DMA engine, a cryptography engine, a compression engine, a decompression engine, and so forth) to enable or disable within the particular host logic shell. The particular host logic shell can be used to encapsulate the application logic when the configurable hardware is configured so that the application logic can communicate only with external components using predefined and protected interfaces.

At 920, the configuration data can be generated for the configurable hardware. Generating the configuration data can include verifying the application logic complies with one or more criteria of the compute services provider, integrating the application logic into the particular host logic shell, synthesizing the application logic, and/or placing and routing the application logic. The configuration data can include data for implementing the application logic and/or host logic on the configurable hardware. The configuration data can include data for implementing multiple components at one or more times during the operation of the configurable hardware. For example, the configuration data can include a static logic component (to be loaded during an initialization sequence of the configurable hardware) and one or more reconfigurable components (to be loaded after the initialization sequence of the configurable hardware). The different reconfigurable components can be associated with overlapping or non-overlapping regions of the configurable hardware. The configuration data can include a host logic component and/or an application logic component. The configuration data can be generated in one or more formats. As one example, the configuration data can be a full or partial bitstream. Information associated with the configuration data can also be generated. For example, log files, implementation reports, and timing reports can be generated with the configuration data. The implementation and timing reports can be used by a developer or design system to modify, resynthesize, or re-place-and-route the design for the configurable hardware.

At 930, a second request can be received to download the configuration data to a host server computer comprising the configurable hardware. For example, the second request can be for static logic (such as for a host logic design) to be downloaded to the configurable hardware when a new virtual machine instance is launched. As another example, the request can be for reconfigurable logic to be downloaded onto the configurable hardware after the configurable hardware platform is executing. In particular, the request can be for configuration data corresponding to an application logic design and at least a portion (e.g., the portion targeting the reconfigurable area(s) of the configurable hardware) of a host shell adapted for the application logic design. The second request can include information for authorizing a user to access the configuration data.

At 940, the configuration data can be transmitted to the host server computer in response to the second request so that the configurable hardware will be configured with the application logic and the host logic adapted for the application logic. In particular, the configuration data can be transmitted to a management partition of the host server computer and the management partition can cause the configuration data to be loaded onto the configurable hardware. As one example, the configuration data can be transmitted after the requestor is verified to have access to the configuration data.

At 950, a hardware reference identifier can be associated with a virtual machine identifier. For example, the second request (from 930) can include the virtual machine identifier for identifying the configuration data to download. In this manner, the deployment of a virtual machine using the virtual machine image identifier can automatically request configuration data associated with the hardware reference identifier to be downloaded when the virtual machine is instantiated.

Figure 10:
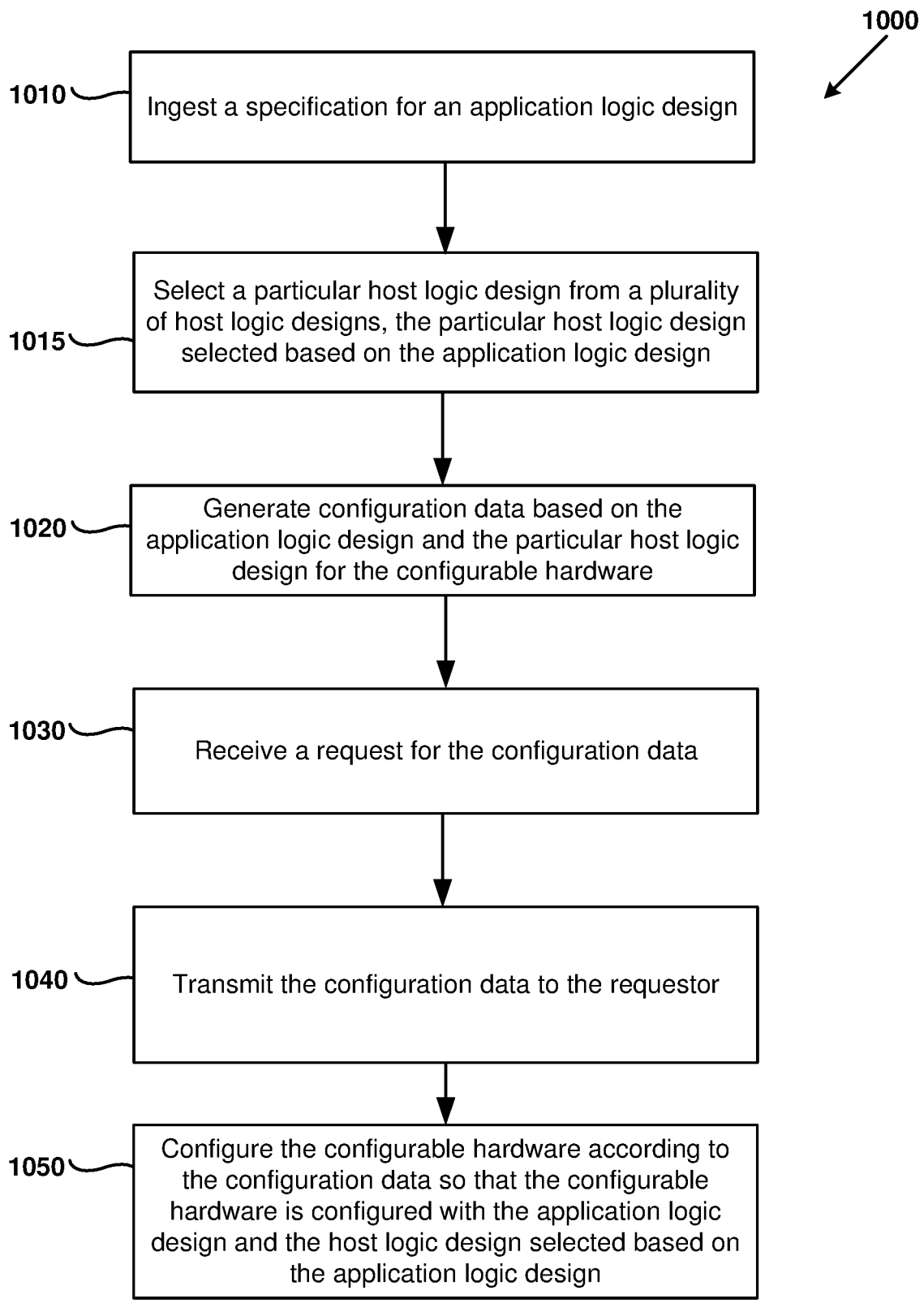
FIG. 10 is a flow diagram of an example method of managing configuration data for configuring configurable hardware in a multi-tenant environment.

FIG. 10 is a flow diagram of an example method 1000 of managing configuration data that can be used to configure or program configurable hardware in, for example, a multi-tenant environment. For example, the method 1000 can be implemented by a logic repository service, such as described above in reference to FIGS. 1 and 4-5.

At 1010, a first specification for application logic of the configurable hardware can be ingested. For example, the application logic can be developed or licensed by a customer of a multi-tenant compute service provider. The application logic can be used to perform a specific computing task for the customer. The specification can include HDL or RTL source code, a netlist, and/or a partial bitstream for the application logic.

At 1015, a particular host logic design can be selected from a plurality of host logic designs. The particular host logic design can be selected based on the application logic design. The particular host logic design can be selected based on user input (such as by receiving a selection from a menu, or by using pragmas in the application logic specification) or without user input (such as by analyzing: an amount of resources used by the application logic, the presence or absence of interfaces used by the application logic, the presence or absence of a reference to an accelerator, and so forth). As one example, features of a given host logic design can be selectable, and a customer can choose the features that are more beneficial for the customer and exclude the features that are less beneficial or exceed the resources of the configurable logic when included with the application logic. The features can include accelerators, internal peripherals, external peripherals, debug or test logic, timers, communication logic (e.g., mailboxes, semaphores, and so forth), monitoring logic (e.g., performance counters or trace logic), and other various functional elements. The host logic design can be specified using HDL or RTL source code, a netlist, and/or a partial bitstream for the host logic.

At 1020, configuration data can be generated based on the application logic design and the particular host logic design for the configurable hardware. When the specifications includes source code, the source code can be synthesized to generate a netlist. A netlist can be placed and routed to generate configuration data. The configuration data can be formatted in a variety of formats, such as a bitstream that identifies programming or settings for individual components of the configurable hardware. Additionally, the configuration data can be stored in a database. For example, configuration data can be stored in a logic repository database (such as the logic repository database 150 of FIG. 1). The configuration data can be stored in association with a machine image, a user, a configurable hardware image, a product code, or any other information that can be used to retrieve the information data. The configuration data can be stored in association with the first and second specifications, and/or with a suite of verification tests. The configuration data can be stored in association with an access list so that the configuration data can be accessed by developers and/or end-users of the configuration data.

At 1030, a request for the configuration data can be received. For example, a request can be received when deploying a new instance within the compute resources provided by the compute service provider. As another example, the request can be received in response to a user application requesting the configuration data to be downloaded during execution of the application. As another example, the request can be received in response to a developer or the compute services provider updating, viewing, or testing the configuration data.

At 1040, the configuration data can be transmitted to the requester. For example, the configuration data can be transmitted to the requester after access privileges of the requester have been verified.

At 1050, the configurable hardware can be configured according to the configuration data. Once configured, the configurable hardware can include the functions specified by the host logic design and the application logic design.

Figure 11:
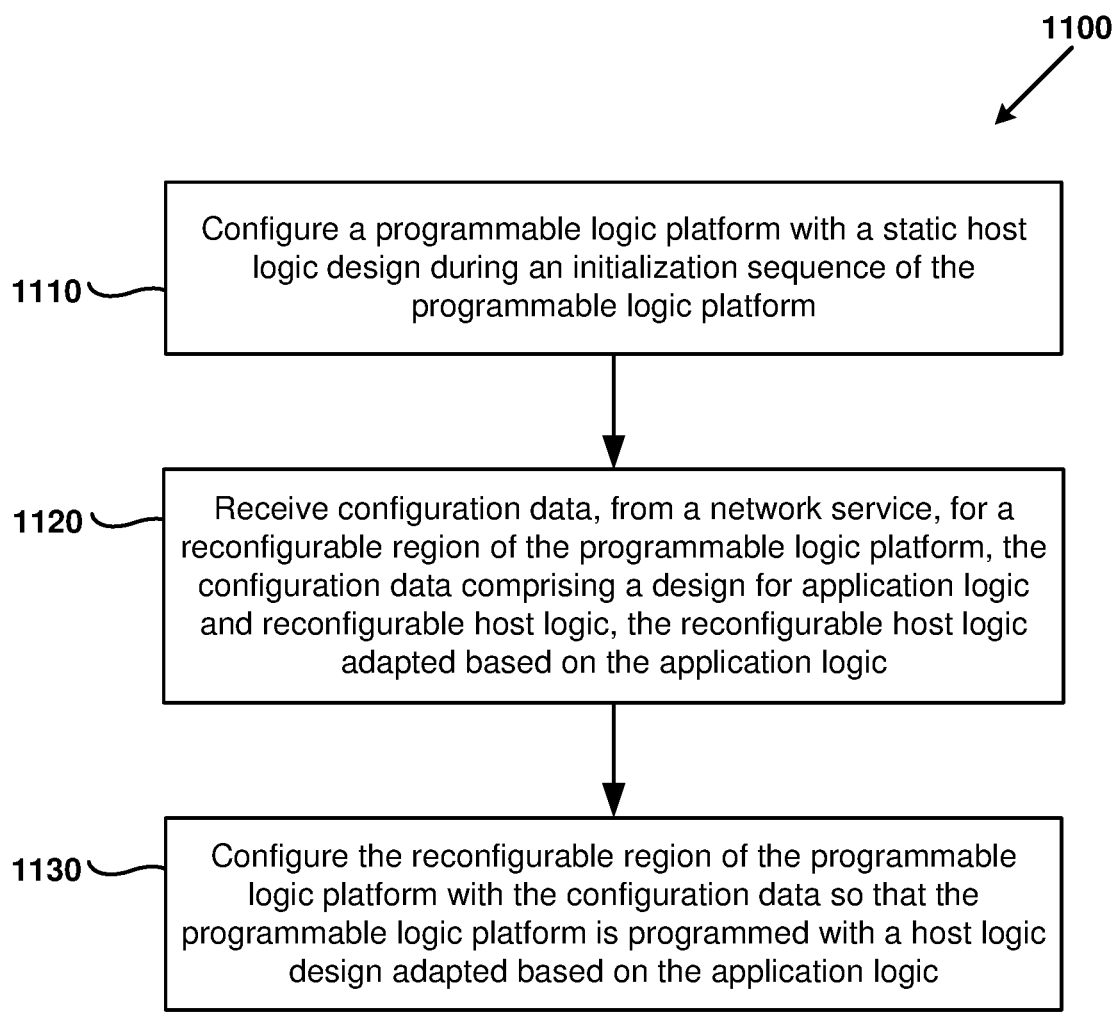
FIG. 11 is a flow diagram of an example method of a process for programming a programmable logic platform.

FIG. 11 is a flow diagram of an example method 1100 of a process for programming a programmable logic platform.

At 1110, the programmable logic platform can be configured with a static host logic design during an initialization sequence of the programmable logic platform. For example, the static host logic design can be stored in a local memory (e.g., an embedded flash memory or in a flash memory in direct communication with the programmable logic platform). The initialization sequence can begin in response to detecting a power-on event or a reset condition, for example. The initialization sequence can include reading the static host logic design from a memory and programming configurable logic of the programmable logic platform with the static host logic design. The initialization sequence can include transitioning the programmable logic platform from a programming state to an operational state so that the configurable logic of the programmable logic platform performs the functions of the static host logic design. For example, the programmable logic platform can transition from the programming state to the operational state after the configuration data for the static logic has been read off of the local memory. The transition to the operational state can be indicated by deasserting a reset signal or deasserting a programming signal of the programmable logic platform, for example. Configuring the configurable logic of the programmable logic platform with the static host logic design can be a prerequisite for loading application logic and reconfigurable host logic onto the configurable logic. For example, the static host logic design can include a host interface that is used to communicate with a network service directly over a network or indirectly via a server computer that is directly connected to the network.

At 1120, configuration data can be received from a network service. The configuration data can be used for a reconfigurable region of the programmable logic platform. The configuration data can include a design for application logic and reconfigurable host logic. The reconfigurable host logic can be adapted based on the application logic. The reconfigurable host logic and the static host logic can encapsulate the application logic and provide an interface to external pins of the programmable logic platform.

At 1130, the reconfigurable region of the programmable logic platform can be configured with the configuration data so that the programmable logic platform is programmed with the host logic design adapted based on the application logic.

Example Computing Environment

Figure 12:
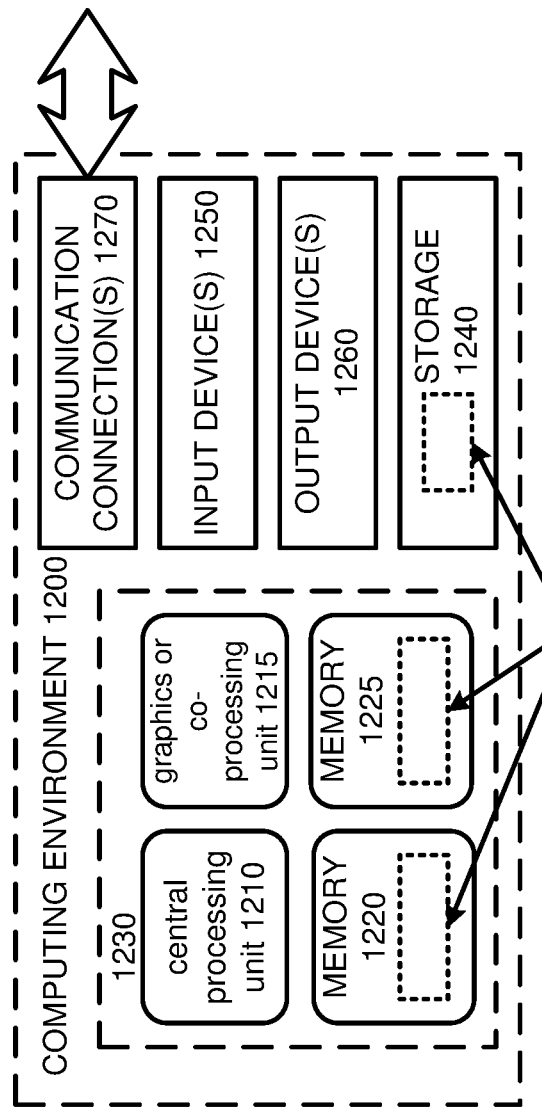
FIG. 12 depicts a generalized example of a suitable computing environment in which the described innovations may be implemented.

FIG. 12 depicts a generalized example of a suitable computing environment 1200 in which the described innovations may be implemented. The computing environment 1200 is not intended to suggest any limitation as to scope of use or functionality, as the innovations may be implemented in diverse general-purpose or special-purpose computing systems. For example, the computing environment 1200 can be any of a variety of computing devices (e.g., desktop computer, laptop computer, server computer, tablet computer, etc.)

With reference to FIG. 12, the computing environment 1200 includes one or more processing units 1210, 1215 and memory 1220, 1225. In FIG. 12, this basic configuration 1230 is included within a dashed line. The processing units 1210, 1215 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power.

For example, FIG. 12 shows a central processing unit 1210 as well as a graphics processing unit or co-processing unit 1215. The tangible memory 1220, 1225 may be volatile memory (e.g., registers, cache, RAM), non-volatile memory (e.g., ROM, EEPROM, flash memory, etc.), or some combination of the two, accessible by the processing unit(s). The memory 1220, 1225 stores software 1280 implementing one or more innovations described herein, in the form of computer-executable instructions suitable for execution by the processing unit(s).

A computing system may have additional features. For example, the computing environment 1200 includes storage 1240, one or more input devices 1250, one or more output devices 1260, and one or more communication connections 1270. An interconnection mechanism (not shown) such as a bus, controller, or network interconnects the components of the computing environment 1200. Typically, operating system software (not shown) provides an operating environment for other software executing in the computing environment 1200, and coordinates activities of the components of the computing environment 1200.

The tangible storage 1240 may be removable or non-removable, and includes magnetic disks, magnetic tapes or cassettes, CD-ROMs, DVDs, or any other medium which can be used to store information in a non-transitory way and which can be accessed within the computing environment 1200. The storage 1240 stores instructions for the software 1280 implementing one or more innovations described herein.

The input device(s) 1250 may be a touch input device such as a keyboard, mouse, pen, or trackball, a voice input device, a scanning device, or another device that provides input to the computing environment 1200. The output device(s) 1260 may be a display, printer, speaker, CD-writer, or another device that provides output from the computing environment 1200.

The communication connection(s) 1270 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, or any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only examples of the invention and should not be taken as limiting the scope of the invention. We claim as our invention all that comes within the scope of these claims.

What is claimed is:

1. A method of providing configurable hardware, the method comprising:
   generating configuration data corresponding to a hardware design for a field-programmable gate array (FPGA), the configuration data including the hardware design and a host logic shell, wherein the configuration data is compatible with an instance type;

receiving a request to launch a virtual machine on a host server computer associated with the instance type, the host server computer comprising the FPGA;

in response to the request, transmitting the configuration data to the host server computer and configuring the FPGA with the configuration data; and launching the virtual machine on the host server computer in response to the request and authorizing use of the FPGA by the virtual machine;

wherein the host logic shell comprises static logic and reconfigurable logic, the static logic configured to be loaded separately from the reconfigurable logic, and the reconfigurable logic encoded in the configuration data based upon the instance type;

wherein the host logic shell includes programming control logic, which prevents programming of the FPGA by components of the hardware design.

2. The method of claim 1, wherein the host logic shell comprises an interface between the hardware design and external pins of the FPGA.

3. The method of claim 1, further comprising:

selecting the host logic shell from a plurality of host logic shells to be included in the configuration data.

4. The method of claim 1, further including receiving the hardware design in a logic repository, which generates the configuration data.

5. A method, comprising:

receiving a specification for an application logic design and selecting a host logic shell from a plurality of host logic shells, the host logic shell encapsulating the application logic design for an instance of configurable hardware;

generating configuration data based on the application logic design and the host logic shell;

receiving a request to launch a virtual machine;

in response to the request, transmitting the configuration data over a network to a server computer, the server computer comprising the instance of the configurable hardware;

programming the configurable hardware with the configuration data; and launching the virtual machine on the server computer and authorizing the virtual machine to communicate with the configurable hardware;

wherein the host logic shell comprises static logic and reconfigurable logic and wherein the configuration data comprises a first partial bitstream encoding the configuration data for the application logic and a second partial bitstream encoding the configuration data for the reconfigurable logic of the host logic shell;

wherein the static logic of the host logic shell comprises host interface logic for communicating with the server computer but prevents the application logic design from communicating directly with the server computer.

6. The method of claim 5, wherein the configurable hardware includes a field-programmable gate array.

7. The method of claim 5, wherein the plurality of host logic shells comprise a first host logic shell including logic for accessing a peripheral and a second host logic shell that prevents accessing the peripheral.

8. The method of claim 5, further including receiving the application logic design in a logic repository, which generates the configuration data.

9. The method of claim 5, wherein the host logic shell includes programming control logic, which prevents programming of the configurable hardware by components of the application logic design.

10. One or more computer-readable storage media comprising computer-executable instructions that, when executed, cause a computing system to perform a method comprising:

generating configuration data corresponding to a hardware design for a field-programmable gate array (FPGA), the configuration data including the hardware design and a host logic shell, wherein the configuration data is compatible with an instance type;

receiving a request to launch a virtual machine on a host server computer associated with the instance type, the host server computer comprising the FPGA;

in response to the request, transmitting the configuration data to the host server computer and configuring the FPGA with the configuration data; and launching the virtual machine on the host server computer in response to the request and authorizing use of the FPGA by the virtual machine;

wherein the host logic shell includes programming control logic, which prevents programming of the FPGA by the hardware design;

wherein static logic of the host logic shell comprises host interface logic for communicating with the host server computer but prevents the hardware design from communicating directly with the host server computer.

11. The computer-readable storage media of claim 10, wherein the host logic shell comprises the static logic and reconfigurable logic.

12. The computer-readable storage media of claim 10, wherein the host logic shell comprises an interface between the hardware design and external pins of the FPGA.

13. The computer-readable storage media of claim 10, wherein the configuration data is stored in a logic repository service and is available for use in response to requests from users.

* * * * *